(12) United States Patent
Shibata et al.

(10) Patent No.: US 9,906,199 B2
(45) Date of Patent: Feb. 27, 2018

(54) MAGNETORESISTIVE EFFECT DEVICE

(71) Applicant: TDK CORPORATION, Tokyo (JP)

(72) Inventors: Tetsuya Shibata, Tokyo (JP); Junichiro Urabe, Tokyo (JP); Atsushi Shimura, Tokyo (JP); Takekazu Yamane, Tokyo (JP)

(73) Assignee: TDK CORPORATION, Tokyo (JP)

(*) Notice: Subject to any disclaimer, the term of this patent is extended or adjusted under 35 U.S.C. 154(b) by 188 days.

(21) Appl. No.: 15/066,350

(22) Filed: Mar. 10, 2016

(65) Prior Publication Data

US 2016/0277000 A1     Sep. 22, 2016

(30) Foreign Application Priority Data

Mar. 16, 2015  (JP) ................... 2015-051848
Sep. 30, 2015  (JP) ................... 2015-193048
Feb. 10, 2016  (JP) ................... 2016-023255

(51) Int. Cl.
  *H03H 2/00*   (2006.01)
  *H01L 43/00*  (2006.01)
  *H03H 7/01*   (2006.01)
  *H03H 1/00*   (2006.01)

(52) U.S. Cl.
  CPC ............ *H03H 2/00* (2013.01); *H01L 43/00* (2013.01); *H03H 2001/0057* (2013.01)

(58) Field of Classification Search
  CPC ...... H03H 7/01; H03H 7/0138–7/0184; H03H 2001/0057
  USPC ........................................ 333/158
  See application file for complete search history.

(56) References Cited

U.S. PATENT DOCUMENTS 7,532,084 B2 *  5/2009  Wada ................ H01P 1/36
                                          333/24.2
7,626,471 B2 * 12/2009  Kishimoto ........ H01P 1/387
                                          333/1.1
7,678,475 B2 *  3/2010  Slavin ................ B82Y 25/00
                                          257/421

(Continued)

OTHER PUBLICATIONS

Tulapurkar, A.A. et al., "Spin-torque diode effect in magnetic tunnel junctions," Nature, vol. 438, No. 7066, Nov. 17, 2005, pp. 339-342.

*Primary Examiner* — Dean Takaoka
*Assistant Examiner* — Alan Wong
(74) *Attorney, Agent, or Firm* — Oliff PLC

(57) ABSTRACT

A magnetoresistive effect device includes a magnetoresistive effect element including a magnetization fixed layer, a spacer layer, and a magnetization free layer; a first port; a second port; a signal line; an impedance element; and a direct-current input terminal. The first port, the magnetoresistive effect element, and the second port are connected in series in this order via the signal line. The impedance element is connected to ground and to the signal line between the magnetoresistive effect element and the first port or the second port. The direct-current input terminal is connected to the signal line at the opposite side to the impedance element with the magnetoresistive effect element in between the direct-current input terminal and the impedance element. A closed circuit including the magnetoresistive effect element, the signal line, the impedance element, the ground, and the direct-current input terminal is to be formed.

10 Claims, 13 Drawing Sheets

(56) References Cited

U.S. PATENT DOCUMENTS

| | | | |
|---|---|---|---|
| 7,825,744 B2 * | 11/2010 | Kawanami | H01P 1/387 333/1.1 |
| 8,019,315 B2 * | 9/2011 | Kakinuma | H03D 7/00 327/356 |
| 8,583,073 B2 * | 11/2013 | Kakinuma | H03D 7/00 327/356 |
| 2017/0244377 A1 * | 8/2017 | Yamane | H01L 43/02 |

* cited by examiner

MAGNETORESISTIVE EFFECT DEVICE

BACKGROUND OF THE INVENTION

1. Field of the Invention

The present invention relates to a magnetoresistive effect device including a magnetoresistive effect element.

2. Description of the Related Art

The speed of wireless communication has increased in recent years with the increasing functions of mobile communication terminals, such as mobile phones. Since the communication speed is proportional to the band width of frequencies that are used, the number of frequency bands necessary for communication is increased. Accordingly, the number of high-frequency filters that are mounted in mobile communication terminals is increased. Spintronics has been studied in recent years as a field that is probably applicable to new high-frequency components. One phenomenon that has received attention is the spin torque resonance phenomenon, which is caused by a magnetoresistive effect element (refer to Nature, Vol. 438, No. 7066, pp. 339 to 342 17 Nov. 2005). Application of an alternating current to a magnetoresistive effect element causes spin torque resonance in the magnetoresistive effect element, and the resistance value of the magnetoresistive effect element oscillates with a fixed cycle at a frequency corresponding to a spin torque resonance frequency. The spin torque resonance frequency of the magnetoresistive effect element varies with the strength of the magnetic field applied to the magnetoresistive effect element. The spin torque resonance frequency of the magnetoresistive effect element is generally within a high-frequency band from several gigahertz to several tens of gigahertz.

SUMMARY OF THE INVENTION

Although the magnetoresistive effect element may be applied to a high-frequency device, utilizing the spin torque resonance phenomenon, specific configurations to apply the magnetoresistive effect element to the high-frequency device, such as the high-frequency filter, have not been proposed. Accordingly, the present invention aims to provide a magnetoresistive effect device capable of realizing a high-frequency device, such as a high-frequency filter, that includes a magnetoresistive effect element.

A magnetoresistive effect device according to an embodiment of the present invention includes at least one magnetoresistive effect element including a magnetization fixed layer, a spacer layer, and a magnetization free layer, the direction of magnetization of which is capable of being varied; a first port through which a high-frequency signal is input; a second port through which a high-frequency signal is output; a signal line; an impedance element; and a direct-current input terminal. The first port, the magnetoresistive effect element, and the second port are connected in series in this order via the signal line. The impedance element is connected to ground and to the signal line between the magnetoresistive effect element and the first port or the second port. The direct-current input terminal is connected to the signal line at the opposite side to the impedance element with the magnetoresistive effect element in between the direct-current input terminal and the impedance element. A closed circuit including the magnetoresistive effect element, the signal line, the impedance element, the ground, and the direct-current input terminal is to be formed.

In the present invention, an "impedance element" is used to mean a choke coil or a resistance element. In addition, in the present invention, the "choke coil" is used as a generic term of elements having a function to cut off high-frequency components of current with inductor components and pass direct current components of the current.

With the above magnetoresistive effect device, the input of the high-frequency signal from the first port to the magnetoresistive effect element via the signal line enables the spin torque resonance to be induced in the magnetoresistive effect element. Due to the spin torque resonance, the magnetoresistive effect element may be considered as an element in which the resistance value oscillates with a fixed cycle at a frequency corresponding to the spin torque resonance frequency. With this effect, the element impedance at the frequency equal to the spin torque resonance frequency of the magnetoresistive effect element is reduced. The connection of the first port, the magnetoresistive effect element, and the second port through which the high-frequency signal is output in series in this order enables the high-frequency signal to be cut off at a non-resonant frequency with high impedance and to be passed at a resonant frequency with low impedance. In other words, the magnetoresistive effect device is capable of having frequency characteristics as a high-frequency filter.

The impedance element connected to the signal line and the ground does not pass the high-frequency signal but selectively causes the direct current signal to flow to the ground. Accordingly, the direct current supplied from the direct-current input terminal flows through the closed circuit including the magnetoresistive effect element, the signal line, the impedance element, the ground, and the direct-current input terminal. The closed circuit allows the direct current to be efficiently applied to the magnetoresistive effect element. In response to the application of the direct current, the spin torque is increased and the amplitude of the oscillating resistance value is increased in the magnetoresistive effect element. Since the increase in the amplitude of the oscillating resistance value increases the amount of change in element impedance of the magnetoresistive effect element, the magnetoresistive effect device functions as a high-frequency filter having a wide range of cut-off characteristics and bandpass characteristics.

In addition, since varying the direct current applied from the direct-current input terminal enables the spin torque resonance frequency of the magnetoresistive effect element to be variably controlled, the magnetoresistive effect device functions as a variable frequency filter.

The magnetoresistive effect device may further include at least one magnetic-field applying mechanism for applying a magnetic field to the magnetoresistive effect element.

In the magnetoresistive effect device, the magnetic-field applying mechanism may vary the magnetic field to vary a spin torque resonance frequency of the magnetoresistive effect element.

With the above magnetoresistive effect device, since the spin torque resonance frequency of the magnetoresistive effect element is capable of being variably controlled, the magnetoresistive effect device functions as the variable frequency filter.

In the magnetoresistive effect device, the at least one magnetoresistive effect element may include a plurality of magnetoresistive effect elements having different spin torque resonance frequencies from each other, and the magnetoresistive effect elements may be connected in parallel to each other.

With the above magnetoresistive effect device, since the magnetoresistive effect elements having different spin torque resonance frequencies from each other are connected in parallel to each other, the impedance of the multiple magnetoresistive effect elements near the multiple frequencies equal to the spin torque resonance frequencies of the respective magnetoresistive effect elements is reduced, and a passband having a certain width is provided. In addition, varying the direct current or the magnetic field to be applied to the magnetoresistive effect elements enables the positions of the passbands to be varied. Accordingly, the magnetoresistive effect device functions as a variable frequency filter capable of varying the position of the passband.

In addition, the combined impedance of the multiple magnetoresistive effect elements near the spin torque resonance frequencies of the multiple magnetoresistive effect elements connected in parallel to each other is lower than the impedance of each of the magnetoresistive effect elements, and the passband loss of the filter is reduced. Accordingly, the magnetoresistive effect device functions as a high-frequency filter having excellent characteristics.

In the magnetoresistive effect device, the at least one magnetoresistive effect element may include a plurality of magnetoresistive effect elements, the at least one magnetic-field applying mechanism may include a plurality of magnetic-field applying mechanisms, and the magnetoresistive effect elements may be connected in parallel to each other and the magnetic-field applying mechanisms are provided so as to apply an individual magnetic field to each of the magnetoresistive effect elements.

With the above magnetoresistive effect device, since the magnetoresistive effect device has the multiple magnetic-field applying mechanisms so as to apply an individual magnetic field to each of the multiple magnetoresistive effect elements, the magnetoresistive effect device is capable of individually controlling the spin torque resonance frequencies of the respective magnetoresistive effect elements. In addition, since the multiple magnetoresistive effect elements are connected in parallel to each other, the impedance of the multiple magnetoresistive effect elements near the multiple frequencies equal to the spin torque resonance frequencies of the respective magnetoresistive effect elements is reduced, and a passband having a certain width is provided. Furthermore, varying the direct current or the magnetic field to be applied to each of the magnetoresistive effect elements enables the bandwidth of the magnetoresistive effect device to be arbitrarily varied. Accordingly, the magnetoresistive effect device functions as a variable frequency filter capable of arbitrarily varying the passband.

In the magnetoresistive effect device, the at least one magnetoresistive effect element may include a plurality of magnetoresistive effect elements having different spin torque resonance frequencies from each other, and the magnetoresistive effect elements may be connected in series to each other.

With the above magnetoresistive effect device, since the multiple magnetoresistive effect elements having different spin torque resonance frequencies from each other are connected in series to each other, the impedance of the multiple magnetoresistive effect elements near the multiple frequencies equal to the spin torque resonance frequencies of the respective magnetoresistive effect elements is reduced, and a passband having a certain width is provided. In addition, varying the direct current or the magnetic field to be applied to the magnetoresistive effect elements enables the positions of the passbands to be varied. Accordingly, the magnetoresistive effect device functions as the variable frequency filter capable of varying the position of the passband.

In the magnetoresistive effect device, the at least one magnetoresistive effect element may include a plurality of magnetoresistive effect elements, the at least one magnetic-field applying mechanism may include a plurality of magnetic-field applying mechanisms, and the magnetoresistive effect elements may be connected in series to each other and the magnetic-field applying mechanisms are provided so as to apply an individual magnetic field to each of the magnetoresistive effect elements.

With the above magnetoresistive effect device, since the magnetoresistive effect device has the multiple magnetic-field applying mechanisms so as to apply an individual magnetic field to each of the multiple magnetoresistive effect elements, the magnetoresistive effect device is capable of individually controlling the spin torque resonance frequencies of the respective magnetoresistive effect elements. In addition, since the multiple magnetoresistive effect elements are connected in series to each other, the impedance of the multiple magnetoresistive effect elements near the multiple frequencies equal to the spin torque resonance frequencies of the respective magnetoresistive effect elements is reduced, and a passband having a certain width is provided. Furthermore, varying the direct current or the magnetic field to be applied to each of the magnetoresistive effect elements enables the bandwidth of the magnetoresistive effect device to be arbitrarily varied. Accordingly, the magnetoresistive effect device functions as the variable frequency filter capable of arbitrarily varying the passband.

In the magnetoresistive effect device, plan view shapes of the magnetoresistive effect elements having different spin torque resonance frequencies from each other may have different aspect ratios from each other. Here, "plan view shapes" mean the shapes of the magnetoresistive effect elements when the magnetoresistive effect elements are viewed from above a plane perpendicular to the stacking direction of the respective layers composing the magnetoresistive effect elements. "The aspect ratio" means the ratio of the length of long sides to the length of short sides of a rectangle circumscribed around the plan view shape of the magnetoresistive effect element with a minimum area.

With the above magnetoresistive effect device, since the plan view shapes of the multiple magnetoresistive effect elements having different spin torque resonance frequencies from each other have different aspect ratios from each other, it is possible to manufacture the multiple magnetoresistive effect elements having different spin torque resonance frequencies from each other through the same process. Specifically, since the multiple magnetoresistive effect elements have the same film structure in the magnetoresistive effect device, it is possible to collectively form the films of the layers composing the multiple magnetoresistive effect elements.

In the magnetoresistive effect device, the magnetoresistive effect device may not include a magnetoresistive effect element connected to the signal line and the ground in parallel with the second port.

With the above magnetoresistive effect device, since a magnetoresistive effect element connected to the signal line and the ground in parallel with the second port is not included, the magnetoresistive effect device is capable of preventing the input high-frequency signal from flowing into the ground to prevent an increase in loss of the high-frequency signal. The flow of the high-frequency signal into the ground is caused by a reduction in impedance at the spin torque resonance frequency of the magnetoresistive effect element connected to the signal line and the ground in parallel with the second port. Accordingly, the magnetoresistive effect device functions as a high-frequency filter having excellent bandpass characteristics.

According to the present invention, the magnetoresistive effect device capable of realizing a high-frequency device, such as a high-frequency filter, including the magnetoresistive effect element is provided.

DESCRIPTION OF THE PREFERRED EMBODIMENTS

Embodiments of the present invention will herein be described in detail with reference to the attached drawings. The present invention is not limited by the content described in the following embodiments. Components described below include components easily supposed by persons skilled in the art, components substantially equivalent to each other, and components within an equivalent range. In addition, the components described below may be appropriately combined with each other. Furthermore, the components may be omitted, replaced, or modified without departing from the true spirit and scope of the invention.

First Embodiment

Figure 1:
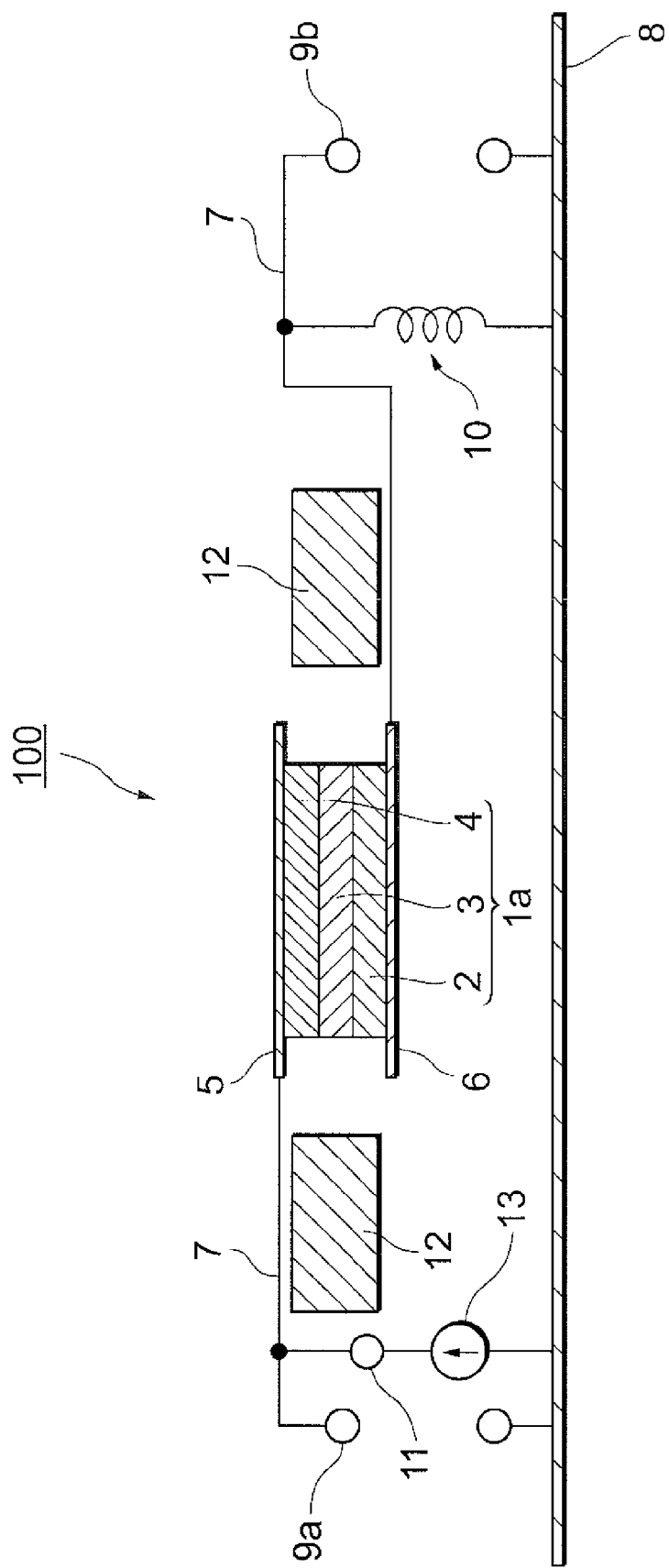
FIG. 1 is a schematic cross-sectional view of a magnetoresistive effect device according to a first embodiment.

FIG. 1 is a schematic cross-sectional view of a magnetoresistive effect device 100 according to a first embodiment of the present invention. The magnetoresistive effect device 100 includes a magnetoresistive effect element 1a including a magnetization fixed layer 2, a spacer layer 3, and a magnetization free layer 4, an upper electrode 5, a lower electrode 6, a first port 9a, a second port 9b, a signal line 7, a choke coil 10 as an impedance element, a direct-current input terminal 11, and a magnetic-field applying mechanism 12. The first port 9a, the magnetoresistive effect element 1a, and the second port 9b are connected in series in this order via the signal line 7. The choke coil 10 is connected to ground 8 and to the signal line 7 between the magnetoresistive effect element 1a and the second port 9b. The direct-current input terminal 11 is connected to the signal line 7 at the opposite side to the choke coil 10 with the magnetoresistive effect element 1a in between the direct-current input terminal 11 and the choke coil 10. Connection of a direct-current source 13 connected to the ground 8 to the direct-current input terminal 11 forms a closed circuit including the magnetoresistive effect element 1a, the signal line 7, the choke coil 10, the ground 8, and the direct-current input terminal 11. The magnetoresistive effect device 100 does not include a magnetoresistive effect element connected to the signal line 7 and the ground 8 in parallel with the second port 9b.

The first port 9a is an input port through which a high-frequency signal, which is an alternating current signal, is input and the second port 9b is an output port through which a high-frequency signal is output. The signal line 7 is electrically connected to the magnetoresistive effect element 1a via the upper electrode 5 and the lower electrode 6 so as to sandwich the magnetoresistive effect element 1a. The high-frequency signal input through the first port 9a flows through the magnetoresistive effect element 1a and is supplied to the second port 9b. Attenuation (S21), which is a dB value of a power ratio (output power/input power) when the high-frequency signal is supplied from the first port 9a to the second port 9b, may be measured by a high-frequency measuring device, such as a network analyzer.

The upper electrode 5 and the lower electrode 6 serve as a pair of electrodes and are disposed in the stacking direction of the respective layers composing the magnetoresistive effect element 1a with the magnetoresistive effect element 1a sandwiched therebetween. Specifically, the upper electrode 5 and the lower electrode 6 function as a pair of electrodes to cause a signal (current) to flow through the magnetoresistive effect element 1a in a direction intersecting with the face of each layer composing the magnetoresistive effect element 1a, for example, in a direction (stacking direction) perpendicular to the face of each layer composing the magnetoresistive effect element 1a. Each of the upper electrode 5 and the lower electrode 6 is preferably composed of a film made of Ta, Cu, Au, AuCu, or Ru or a film made of two or more of the above materials. One end (at the magnetization free layer 4 side) of the magnetoresistive effect element 1a is electrically connected to the signal line 7 via the upper electrode 5 and the other end (at the magnetization fixed layer 2 side) of the magnetoresistive effect element 1a is electrically connected to the signal line 7 via the lower electrode 6.

The ground 8 functions as reference voltage. The shape of the signal line 7 with the ground 8 is preferably of a micro strip line (MSL) type or a coplanar waveguide (CPW) type. In design of the micro strip line shape or the coplanar waveguide shape, designing the width of the signal line 7 and the distance to the ground so that the characteristic impedance of the signal line 7 is equal to the impedance of a circuit system enables the transmission loss through the signal line 7 to be reduced.

The choke coil 10 is connected between the signal line 7 and the ground 8 and has a function to cut off high-frequency components of current with its inductance component and pass direct-current components of the current. In the present specification, the "choke coil" is used as a generic term of elements having a function to cut off high-frequency components of current with inductor components and pass direct current components of the current. The choke coil 10 may be a chip inductor or an inductor composed of a pattern line. Alternatively, the choke coil 10 may be a resistance element having an inductance component. The choke coil 10 preferably has an inductance value of 10 nH or more. The use of the choke coil 10 enables direct current applied from the direct-current input terminal 11 to flow through the closed circuit including the magnetoresistive effect element 1a, the signal line 7, the choke coil 10, the ground 8, and the direct-current input terminal 11 without degrading the characteristics of the high-frequency signal passing through the magnetoresistive effect element 1a.

The direct-current input terminal 11 is connected to the signal line 7 at the opposite side to the choke coil 10 with the magnetoresistive effect element 1a in between the direct-current input terminal 11 and the choke coil 10. More specifically, the direct-current input terminal 11 is connected to the signal line 7 between the magnetoresistive effect element 1a and the first port 9a. The connection of the direct-current source 13 to the direct-current input terminal 11 enables the direct current to be applied to the magnetoresistive effect element 1a. In the magnetoresistive effect device 100 illustrated in FIG. 1, the direct current flowing from the magnetization free layer 4 to the magnetization fixed layer 2 in the magnetoresistive effect element 1a is applied to the magnetoresistive effect element 1a. A choke coil or a resistance element for cutting off the high-frequency signal may be connected in series between the direct-current input terminal 11 and the direct-current source 13.

The direct-current source 13 is connected to the ground 8 and the direct-current input terminal 11 and applies the direct current from the direct-current input terminal 11 to the closed circuit including the magnetoresistive effect element 1a, the signal line 7, the choke coil 10, the ground 8, and the direct-current input terminal 11. The direct-current source 13 is composed of, for example, a circuit in which a variable resistor is combined with a direct-current voltage source and is capable of varying the current value of the direct current. The direct-current source 13 may be composed of a circuit which is capable of generating constant direct current and in which a fixed resistor is combined with a direct-current voltage source.

The magnetic-field applying mechanism 12 is disposed near the magnetoresistive effect element 1a and applies a magnetic field to the magnetoresistive effect element 1a. For example, the magnetic-field applying mechanism 12 is of an electromagnetic type or a strip line type capable of variably controlling the strength of the applied magnetic field using voltage or current. Alternatively, the magnetic-field applying mechanism 12 may be a combination of the electromagnetic type or the strip line type with a permanent magnet that supplies only a constant magnetic field. In addition, the magnetic-field applying mechanism 12 varies the magnetic field to be applied to the magnetoresistive effect element 1a to enable the spin torque resonance frequency of the magnetoresistive effect element 1a to be varied.

The magnetization fixed layer 2 is made of a ferromagnetic material and the magnetization direction of the magnetization fixed layer 2 is substantially fixed to one direction. The magnetization fixed layer 2 is preferably made of a material having high spin polarizability, such as Fe, Co, Ni, an alloy of Ni and Fe, an alloy of Fe and Co, or an ally of Fe, Co, and B. This achieves a high magnetoresistive change rate. The magnetization fixed layer 2 may be made of a Heusler alloy. The magnetization fixed layer 2 preferably has a film thickness of 1 nm to 10 nm. An antiferromagnetic layer may be added so as to be in contact with the magnetization fixed layer 2 in order to fix the magnetization of the magnetization fixed layer 2. Alternatively, the magnetization of the magnetization fixed layer 2 may be fixed using magnetic anisotropy caused by the crystal structure of the magnetization fixed layer 2 or the shape thereof. The antiferromagnetic layer may be made of FeO, CoO, NiO, $CuFeS_2$, IrMn, FeMn, PtMn, Cr, or Mn.

The spacer layer 3 is arranged between the magnetization fixed layer 2 and the magnetization free layer 4. The magnetization of the magnetization fixed layer 2 and the magnetization of the magnetization free layer 4 interact with each other to achieve the magnetoresistive effect. The spacer layer 3 may be formed of a layer made of a conductive material, an insulating material, or a semiconductor material. Alternatively, the spacer layer 3 may be formed of a layer in which a current flow point composed of a conductor is included in an insulator.

When a non-magnetic conductive material is used for the spacer layer 3, the non-magnetic conductive material may be Cu, Ag, Au, or Ru. In this case, a giant magnetoresistive (GMR) effect is produced in the magnetoresistive effect element 1a. When the GMR effect is used, the spacer layer 3 preferably has a film thickness of about 0.5 nm to 3.0 nm.

When a non-magnetic insulating material is used for the spacer layer 3, the non-magnetic insulating material may be $Al_2O_3$ or MgO. In this case, a tunnel magnetoresistive (TMR) effect is produced in the magnetoresistive effect element 1a. Adjusting the film thickness of the spacer layer 3 so that a coherent tunnel effect is produced between the magnetization fixed layer 2 and the magnetization free layer 4 achieves a high magnetoresistive change rate. When the TMR effect is used, the spacer layer 3 preferably has a film thickness of about 0.5 nm to 3.0 nm.

When a non-magnetic semiconductor material is used for the spacer layer 3, the non-magnetic semiconductor material may be ZnO, $In_2O_3$, $SnO_2$, ITO, $GaO_x$, or $Ga_2O_x$. The spacer layer 3 preferably has a film thickness of about 1.0 nm to 4.0 nm.

When a layer in which the current flow point composed of a conductor is included in a non-magnetic insulator is used as the spacer layer 3, the spacer layer 3 preferably has a structure in which the current flow point composed of a conductor made of, for example, CoFe, CoFeB, CoFeSi, CoMnGe, CoMnSi, CoMnAl, Fe, Co, Au, Cu, Al, or Mg is included in the mon-magnetic insulator made of $Al_2O_3$ or MgO. In this case, the spacer layer 3 preferably has a film thickness of about 0.5 nm to 2.0 nm.

The direction of the magnetization of the magnetization free layer 4 is capable of being varied with an externally applied magnetic field or spin polarized electrons. The magnetization free layer 4 is made of a ferromagnetic material. When the magnetization free layer 4 is made of a material having a magnetic easy axis in an in-plane direction, the material may be, for example, CoFe, CoFeB, CoFeSi, CoMnGe, CoMnSi, or CoMnAl. The magnetization free layer 4 preferably has a film thickness of about 1 nm to 10 nm. When the magnetization free layer 4 is made of a material having the magnetic easy axis in a plane normal direction, the material may be, for example, Co, a CoCr-based alloy, a Co multilayer film, a CoCrPt-based alloy, an FePt-based alloy, an SmCo-based alloy including rare earth, or a TbFeCo alloy. The magnetization free layer 4 may be made of a Heusler alloy. A material having high spin polarizability may be disposed between the magnetization free layer 4 and the spacer layer 3. This achieves the high magnetoresistive change rate. The material having high spin polarizability may be, for example, a CoFe alloy or a CoFeB alloy. Each of the CoFe alloy and the CoFeB alloy preferably has a film thickness of about 0.2 nm to 1.0 nm.

A cap layer, a seed layer, or a buffer layer may be provided between the upper electrode 5 and the magnetoresistive effect element 1a and between the lower electrode 6 and the magnetoresistive effect element 1a. Each of the cap layer, the seed layer, and the buffer layer may be made of Ru, Ta, Cu, or Cr or may be formed of a stacked film including a Ru layer, a Ta layer, a Cu layer, and a Cr layer. The cap layer, the seed layer, and the buffer layer preferably each have a film thickness of about 2 nm to 10 nm.

When the magnetoresistive effect element 1a has a rectangular shape (including a square shape) in plan view, the magnetoresistive effect element 1a desirably has long sides of about 100 nm or 100 nm or less. When the magnetoresistive effect element 1a does not have a rectangular shape in plan view, the long sides of a rectangle circumscribed around the plan view shape of the magnetoresistive effect element 1a with a minimum area are defined as the long sides of the magnetoresistive effect element 1a. When the long sides of the magnetoresistive effect element 1a are short, for example, about 100 nm, the magnetization of the magnetization free layer 4 is capable of having a single magnetic domain to realize the spin torque resonance phenomenon with high efficiency. The "plan view shape" means the shape of the magnetoresistive effect element when the magnetoresistive effect element is viewed from above a plane perpendicular to the stacking direction of the respective layers composing the magnetoresistive effect element.

The spin torque resonance phenomenon will now be described.

Upon input of the high-frequency signal of a frequency equal to the spin torque resonance frequency specific to the magnetoresistive effect element 1a, the magnetization of the magnetization free layer 4 oscillates at the spin torque resonance frequency. This phenomenon is called the spin torque resonance phenomenon. The element resistance value of the magnetoresistive effect element 1a is determined by the relative angle between the magnetization of the magnetization fixed layer 2 and the magnetization of the magnetization free layer 4. Accordingly, the resistance value of the magnetoresistive effect element 1a in the spin torque resonance varies with a fixed cycle with the oscillation of the magnetization of the magnetization free layer 4. In other words, the magnetoresistive effect element 1a is capable of being considered as a resistor oscillation element in which the resistance value varies with a fixed cycle at the spin torque resonance frequency. In addition, upon input of the high-frequency signal of a frequency equal to the spin torque resonance frequency into the resistor oscillation element, the phase of the magnetic field is synchronized with the phase of the high-frequency signal and the impedance for the high-frequency signal is reduced. In other words, the magnetoresistive effect element 1a is capable of being considered as a resistance element in which the impedance of the high-frequency signal is reduced at the spin torque resonance frequency due to the spin torque resonance phenomenon. The spin torque resonance frequency is increased with an increase in strength of the magnetic field applied to the magnetoresistive effect element 1a.

The application of the direct current to the magnetoresistive effect element 1a in the spin torque resonance increases the spin torque to increase the amplitude of the oscillating resistance value. The increase in the amplitude of the oscillating resistance value increases the amount of change in element impedance of the magnetoresistive effect element 1a. The spin torque resonance frequency is reduced with an increase in current density of the applied direct current. Accordingly, the spin torque resonance frequency of the magnetoresistive effect element 1a is capable of being varied by varying the magnetic field from the magnetic-field applying mechanism 12 or by varying the direct current applied from the direct-current input terminal 11.

Due to the spin torque resonance phenomenon, the frequency components that coincide with the spin torque resonance frequency of the magnetoresistive effect element 1a or that are near the spin torque resonance frequency of the magnetoresistive effect element 1a, among the high-frequency components of the high-frequency signal input through the first port 9a, pass through the magnetoresistive effect element 1a in a low impedance state and are supplied to the second port 9b. In other words, the magnetoresistive effect device 100 functions as a high-frequency filter using the frequencies near the spin torque resonance frequency of the magnetoresistive effect element 1a as a passband.

Figure 2:
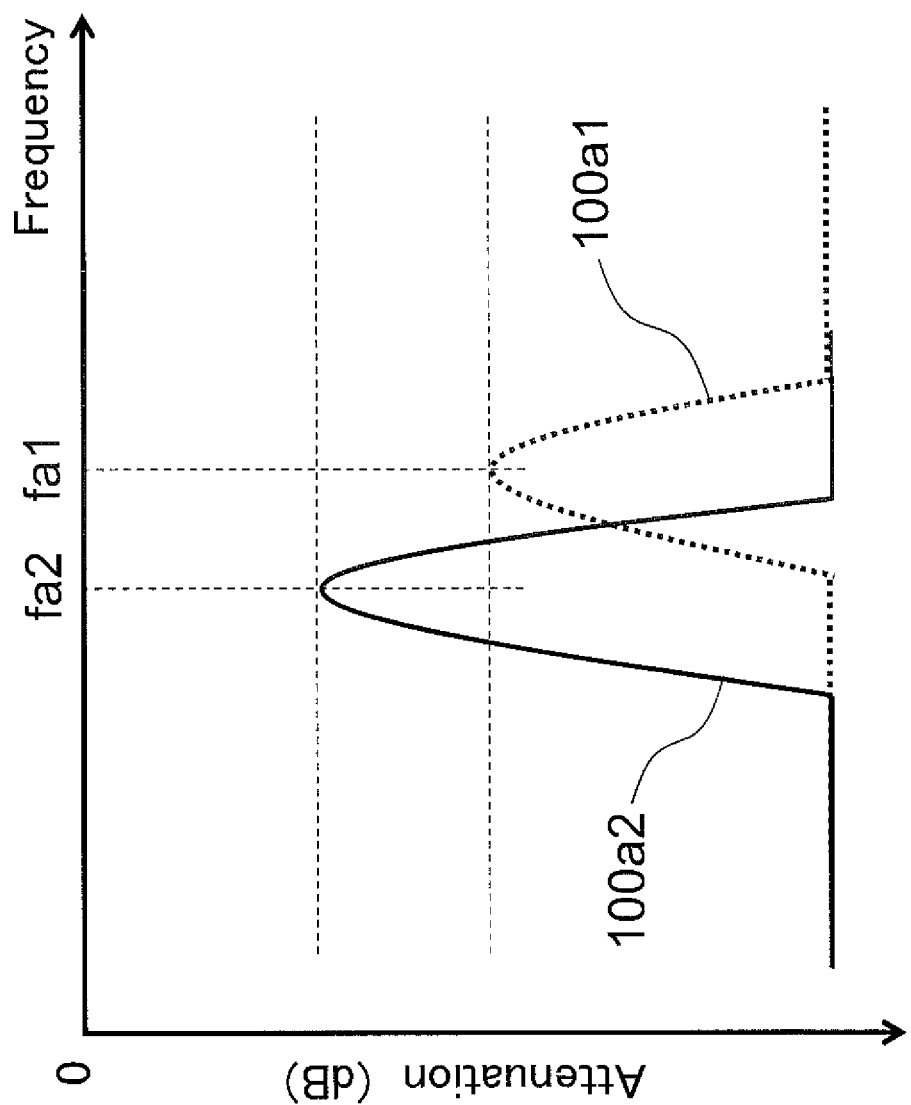
FIG. 2 is a graph illustrating the relationship between frequency and attenuation for direct current in the magnetoresistive effect device according to the first embodiment.
Figure 3:
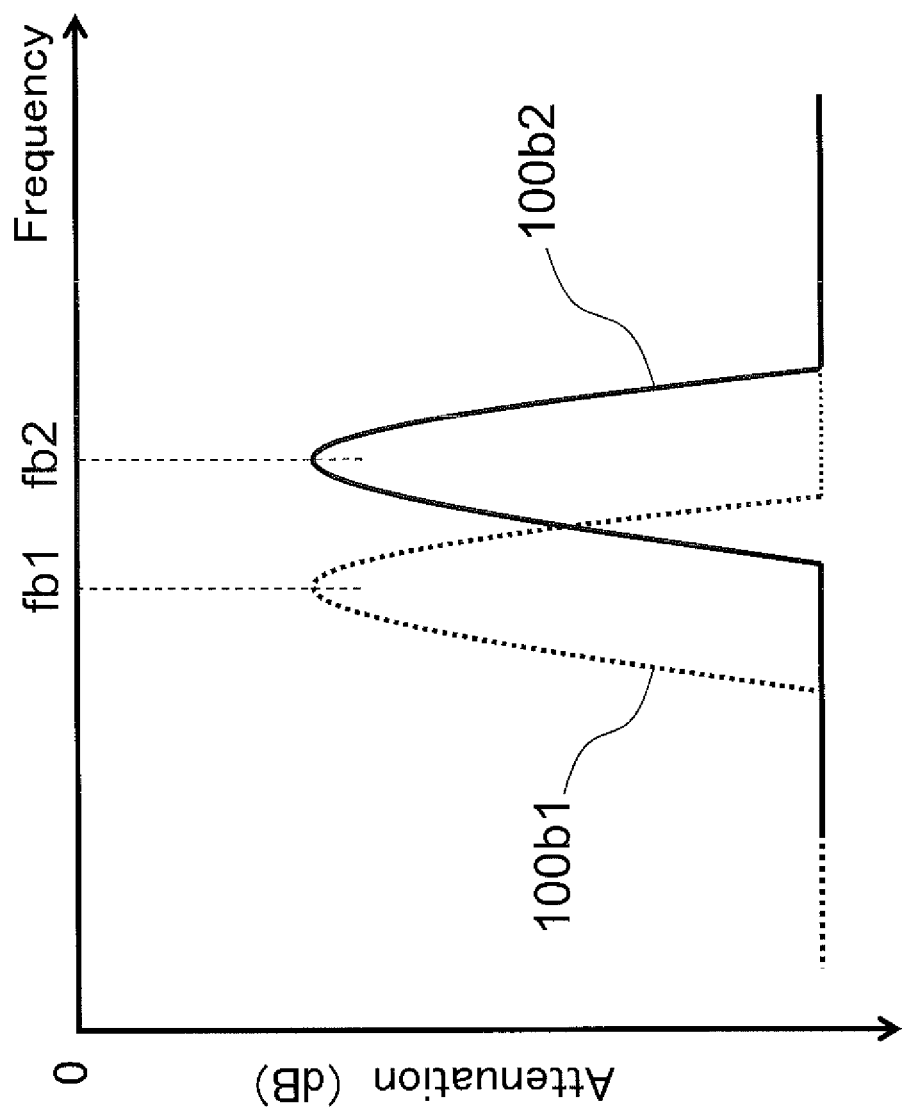
FIG. 3 is a graph illustrating the relationship between the frequency and the attenuation for the strength of a magnetic field in the magnetoresistive effect device according to the first embodiment.

FIG. 2 and FIG. 3 are graphs each illustrating the relationship between the frequency of the high-frequency signal input into the magnetoresistive effect device 100 and the attenuation. Referring to FIG. 2 and FIG. 3, the vertical axis represents attenuation and the horizontal axis represents frequency. FIG. 2 is a graph when a constant magnetic field is applied to the magnetoresistive effect element 1a. Referring to FIG. 2, a plot line 100a1 represents the relationship between the high-frequency signal and the attenuation when the direct current applied from the direct-current input terminal 11 to the magnetoresistive effect element 1a has a value of Ia1 and a plot line 100a2 represents the relationship between the high-frequency signal and the attenuation when the direct current applied from the direct-current input terminal 11 to the magnetoresistive effect element 1a has a value of Ia2. The relationship between the applied direct current values is Ia1<Ia2. FIG. 3 is a graph when constant direct current is applied to the magnetoresistive effect element 1a. Referring to FIG. 3, a plot line 100b1 represents the relationship between the high-frequency signal and the attenuation when the magnetic field applied from the magnetic-field applying mechanism 12 to the magnetoresistive effect element 1a has a strength of Hb1 and a plot line 100b2 represents the relationship between the high-frequency signal and the attenuation when the magnetic field applied from the magnetic-field applying mechanism 12 to the magnetoresistive effect element 1a has a strength of Hb2. The relationship between the strengths of the magnetic fields is Hb1<Hb2.

For example, when the value of the direct current applied from the direct-current input terminal 11 to the magnetoresistive effect element 1a is increased from Ia1 to Ia2, as illustrated in FIG. 2, the amount of reduction in element impedance at the frequencies near the spin torque resonance frequency of the magnetoresistive effect element 1a (the frequencies in the passband) is increased with the variation in the current value. As a result, the high-frequency signal output from the second port 9b is further increased to reduce the attenuation (the absolute value of the attenuation). Accordingly, the magnetoresistive effect device 100 is capable of realizing a high-frequency filter having a wide range of cut-off characteristics and bandpass characteristics. In response to the increase of the direct current value from Ia1 to Ia2 the spin torque resonance frequency of the magnetoresistive effect element 1a is shifted from fa1 to fa2. In other words, the passband is shifted toward low frequencies. Thus, the magnetoresistive effect device 100 may function as a high-frequency filter capable of varying the frequencies of the passband.

Furthermore, when the strength of the magnetic field applied from the magnetic-field applying mechanism 12 is increased from Hb1 to Hb2, as illustrated in FIG. 3, the spin torque resonance frequency of the magnetoresistive effect element 1a is shifted from fb1 to fb2. In other words, the passband is shifted toward high frequencies. The passband is capable of being greatly shifted when the strength of the magnetic field is varied, compared with a case in which the direct current value is varied. In other words, the magnetoresistive effect device 100 may function as the high-frequency filter capable of varying the frequencies of the passband.

When the passband is varied, the phase of a passing signal is varied when attention is focused on a certain frequency in the passband. In other words, the magnetoresistive effect device 100 may also function as a phase shifter capable of varying the phase of a signal of a frequency in the passband.

As described above, the magnetoresistive effect device 100 includes the magnetoresistive effect element 1a including the magnetization fixed layer 2, the spacer layer 3, and the magnetization free layer 4 the direction of magnetization of which is capable of being varied; the first port 9a; the second port 9b; the signal line 7; the choke coil 10 (impedance element); and the direct-current input terminal 11. The first port 9a, the magnetoresistive effect element 1a, and the second port 9b are connected in series in this order via the signal line 7. The choke coil 10 (impedance element) is connected to the ground 8 and to the signal line 7 between the magnetoresistive effect element 1a and the second port 9b. The direct-current input terminal 11 is connected to the signal line 7 at the opposite side to the choke coil 10 (impedance element) with the magnetoresistive effect element 1a in between the direct-current input terminal 11 and the choke coil 10 (impedance element). The closed circuit including the magnetoresistive effect element 1a, the signal line 7, the choke coil 10 (impedance element), the ground 8, and the direct-current input terminal 11 is to be formed.

Accordingly, the input of the high-frequency signal from the first port 9a to the magnetoresistive effect element 1a via the signal line 7 enables the spin torque resonance to be induced in the magnetoresistive effect element 1a. Due to the spin torque resonance, the magnetoresistive effect element 1a may be considered as an element in which the resistance value oscillates with a fixed cycle at a frequency corresponding to the spin torque resonance frequency. With this effect, the element impedance at the frequency equal to the spin torque resonance frequency of the magnetoresistive effect element 1a is reduced. The connection of the first port 9a, the magnetoresistive effect element 1a, and the second port 9b in series in this order enables the high-frequency signal to be cut off at a non-resonant frequency with high impedance and to be passed at a resonant frequency with low impedance. In other words, the magnetoresistive effect device 100 is capable of having frequency characteristics as the high-frequency filter.

The choke coil 10 (impedance element) connected to the signal line 7 and the ground 8 does not pass the high-frequency signal but selectively causes the direct current signal to flow to the ground. Accordingly, the direct current supplied from the direct-current input terminal 11 flows through the closed circuit including the magnetoresistive effect element 1a, the signal line 7, the choke coil 10 (impedance element), the ground 8, and the direct-current input terminal 11. The closed circuit allows the direct current to be efficiently applied to the magnetoresistive effect element 1a. In response to the application of the direct current, the spin torque is increased and the amplitude of the oscillating resistance value is increased in the magnetoresistive effect element 1a. Since the increase in the amplitude of the oscillating resistance value increases the amount of change in element impedance of the magnetoresistive effect element 1a, the magnetoresistive effect device 100 functions as the high-frequency filter having a wide range of the cut-off characteristics and the bandpass characteristics.

In addition, since varying the direct current applied from the direct-current input terminal 11 enables the spin torque resonance frequency of the magnetoresistive effect element 1a to be variably controlled, the magnetoresistive effect device 100 functions as a variable frequency filter.

Furthermore, since the magnetic-field applying mechanism 12 varies the magnetic field to be applied to the magnetoresistive effect element 1a to vary the spin torque resonance frequency of the magnetoresistive effect element 1a, the magnetoresistive effect device 100 functions as the variable frequency filter.

Furthermore, since the magnetoresistive effect device 100 does not include a magnetoresistive effect element connected to the signal line 7 and the ground 8 in parallel with the second port 9b, the magnetoresistive effect device 100 is capable of preventing the input high-frequency signal from flowing into the ground 8 to prevent an increase in loss of the high-frequency signal. The flow of the high-frequency signal into the ground 8 is caused by a reduction in impedance at the spin torque resonance frequency of the magnetoresistive effect element connected to the signal line 7 and the ground 8 in parallel with the second port 9b. Accordingly, the magnetoresistive effect device 100 functions as a high-frequency filter having excellent bandpass characteristics.

Various components may be added to the magnetoresistive effect device 100 of the first embodiment described above. For example, in order to prevent the direct current signal from flowing into a high-frequency circuit connected to the first port 9a, a capacitor for cutting off the direct current signal may be connected in series to the signal line 7 between the first port 9a and the direct-current input terminal 11. Alternatively, in order to prevent the direct current signal from flowing into a high-frequency circuit connected to the second port 9b, a capacitor for cutting off the direct current signal may be connected in series to the signal line 7 between the second port 9b and the choke coil 10.

Second Embodiment

Figure 4:
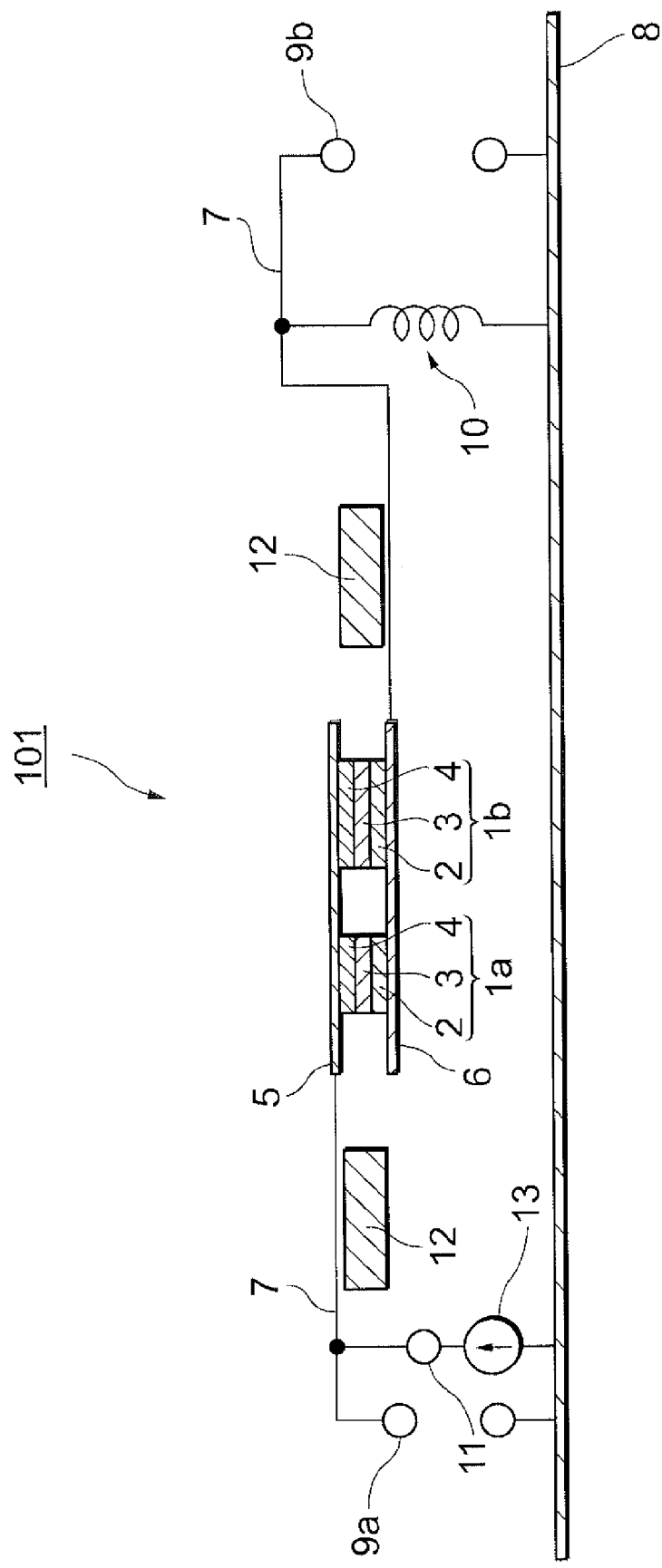
FIG. 4 is a schematic cross-sectional view of a magnetoresistive effect device according to a second embodiment.

FIG. 4 is a schematic cross-sectional view of a magnetoresistive effect device 101 according to a second embodiment of the present invention. Points different from the magnetoresistive effect device 100 of the first embodiment in the magnetoresistive effect device 101 will be mainly described and a description of common points will be appropriately omitted herein. The same reference numerals are used in the second embodiment to identify the same components in the magnetoresistive effect device 100 of the first embodiment and a description of the common components will be omitted herein. The magnetoresistive effect device 101 includes two magnetoresistive effect elements 1a and 1b each including the magnetization fixed layer 2, the spacer layer 3, and the magnetization free layer 4, the upper electrode 5, the lower electrode 6, the first port 9a, the second port 9b, the signal line 7, the choke coil 10 as an impedance element, the direct-current input terminal 11, and the magnetic-field applying mechanism 12. The magnetoresistive effect element 1a is connected in parallel to the magnetoresistive effect element 1b between the upper electrode 5 and the lower electrode 6. The first port 9a, the magnetoresistive effect element 1a or the magnetoresistive effect element 1b, and the second port 9b are connected in series in this order via the signal line 7. The magnetoresistive effect elements 1a and 1b have different spin torque resonance frequencies from each other in a state in which the same magnetic field and the direct current having the same current density are applied. More specifically, although the magnetoresistive effect elements 1a and 1b have the same film structure and have rectangular shapes in plan view, the plan view shape of the magnetoresistive effect element 1a is different from the plan view shape of the magnetoresistive effect element 1a in the aspect ratio. "The same film structure" means that the magnetoresistive effect elements 1a and 1b have the same material and the same film thickness of each layer composing the magnetoresistive effect elements and have the same lamination order of the layers. "The plan view shape" means the shape of each of the magnetoresistive effect elements when the magnetoresistive effect element is viewed from above a plane perpendicular to the stacking direction of the respective layers composing the magnetoresistive effect element. "The aspect ratio" means the ratio of the length of long sides to the length of short sides of a rectangle circumscribed around the plan view shape of the magnetoresistive effect element with a minimum area.

The choke coil 10 is connected to the ground 8 and to the signal line 7 between the magnetoresistive effect elements 1a and 1b, which are connected in parallel to each other, and the second port 9b. The direct-current input terminal 11 is connected to the signal line 7 at the opposite side to the choke coil 10 with the magnetoresistive effect elements 1a and 1b in between the direct-current input terminal 11 and the choke coil 10. The connection of the direct-current source 13 connected to the ground 8 to the direct-current input terminal 11 forms a closed circuit including the magnetoresistive effect element 1a, the magnetoresistive effect element 1b, the signal line 7, the choke coil 10, the ground 8, and the direct-current input terminal 11. The direct current supplied from the direct-current input terminal 11 flows through the closed circuit and is applied to the magnetoresistive effect element 1a and the magnetoresistive effect element 1b.

The magnetization free layer 4 of the magnetoresistive effect element 1a and the magnetization free layer 4 of the magnetoresistive effect element 1b are connected to the same upper electrode 5. The magnetization fixed layer 2 of the magnetoresistive effect element 1a and the magnetization fixed layer 2 of the magnetoresistive effect element 1b are connected to the same lower electrode 6.

The magnetic-field applying mechanism 12 is disposed near the magnetoresistive effect elements 1a and 1b and simultaneously applies the same magnetic field to the magnetoresistive effect elements 1a and 1b. The magnetic-field applying mechanism 12 varies the magnetic fields to be applied to the magnetoresistive effect elements 1a and 1b to vary the spin torque resonance frequencies of the magnetoresistive effect elements 1a and 1b.

Figure 5:
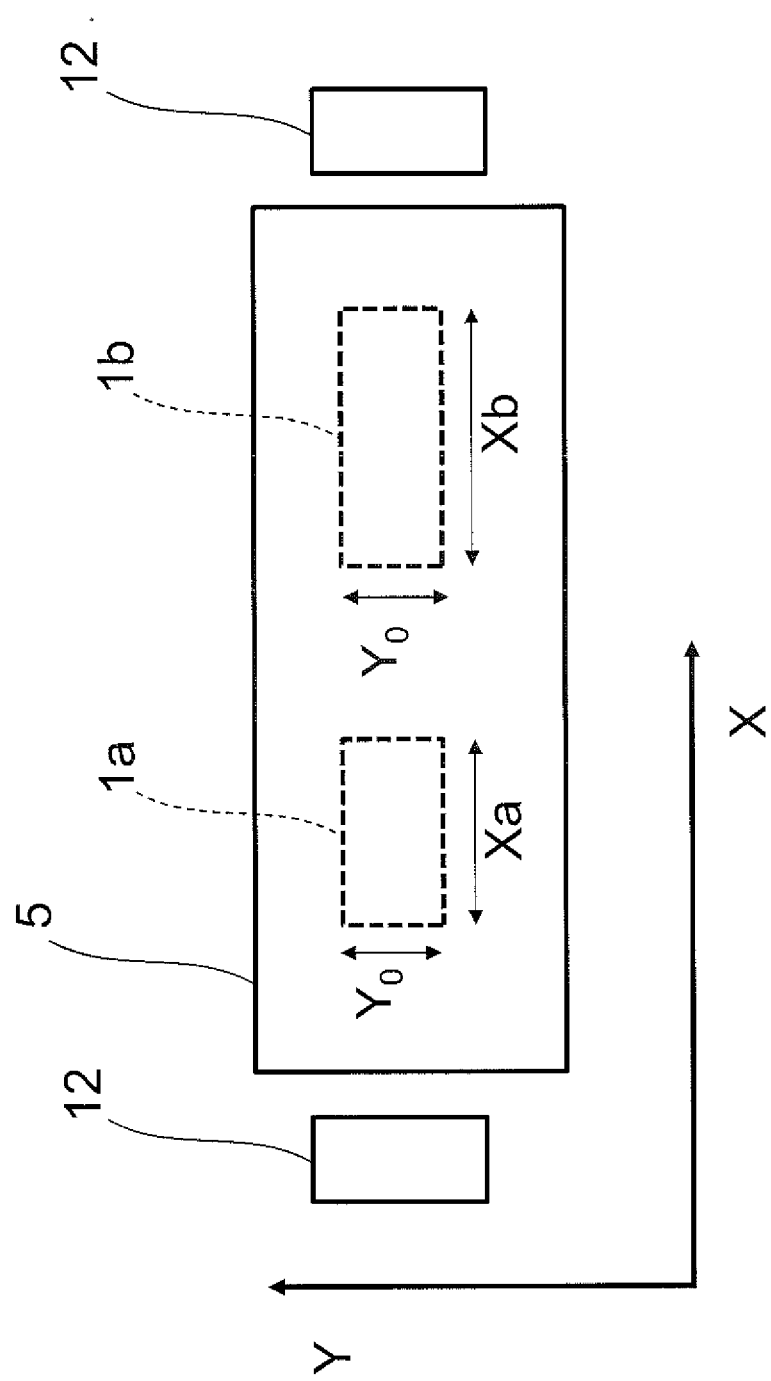
FIG. 5 is a top view of the magnetoresistive effect device according to the second embodiment.

The film structures of the magnetoresistive effect elements 1a and 1b are the same as the film structure of the magnetoresistive effect element 1a of the first embodiment. FIG. 5 is a top view of the magnetoresistive effect device 101. As illustrated in FIG. 5, the magnetoresistive effect elements 1a and 1b have the same dimension $Y_0$ in the Y direction, which is the direction of the short sides of the plan view shapes of the magnetoresistive effect elements 1a and 1b. However, a dimension Xa in the X direction, which is the direction of the long sides of the plane view shape of the magnetoresistive effect element 1a, is different from a dimension Xb in the X direction, which is the direction of the long sides of the plane view shape of the magnetoresistive effect element 1b, and Xa<Xb. Accordingly, the aspect ratio $(Xb/Y_0)$ of the plan view shape of the magnetoresistive effect element 1b is higher than the aspect ratio $(Xa/Y_0)$ of the plan view shape of the magnetoresistive effect element 1a. In consideration of a state in which the same magnetic field and the direct current of the same current density are applied to each magnetoresistive effect element, the spin torque resonance frequency of the magnetoresistive effect element is increased with an increase in aspect ratio of the plan view shape of the magnetoresistive effect element. As a result, a spin torque resonance frequency fb of the magnetoresistive effect element 1b is higher than a spin torque resonance frequency fa of the magnetoresistive effect element 1a. Since differentiating the aspect ratios of the plan view shapes of the multiple magnetoresistive effect elements in the above manner enables the spin torque resonance frequencies to be differentiated from each other even when the magnetoresistive effect elements have the same film structure, it is possible to manufacture the multiple magnetoresistive effect elements having different spin torque resonance frequencies from each other through the same film formation process. In other words, since the multiple magnetoresistive effect elements have the same film structure, it is possible to collectively form the films of the layers composing the multiple magnetoresistive effect elements.

Due to the spin torque resonance phenomenon, the frequency components that coincide with the spin torque resonance frequency of the magnetoresistive effect element 1a or the magnetoresistive effect element 1b or that are near the spin torque resonance frequency of the magnetoresistive effect element 1a or the magnetoresistive effect element 1b, among the high-frequency components of the high-frequency signal input through the first port 9a, pass through the magnetoresistive effect element 1a or the magnetoresistive effect element 1b in a low impedance state and are supplied to the second port 9b. In other words, the magnetoresistive effect device 101 functions as a high-frequency filter using the frequencies near the spin torque resonance frequency of the magnetoresistive effect element 1a or the magnetoresistive effect element 1b as the passband.

Figure 6:
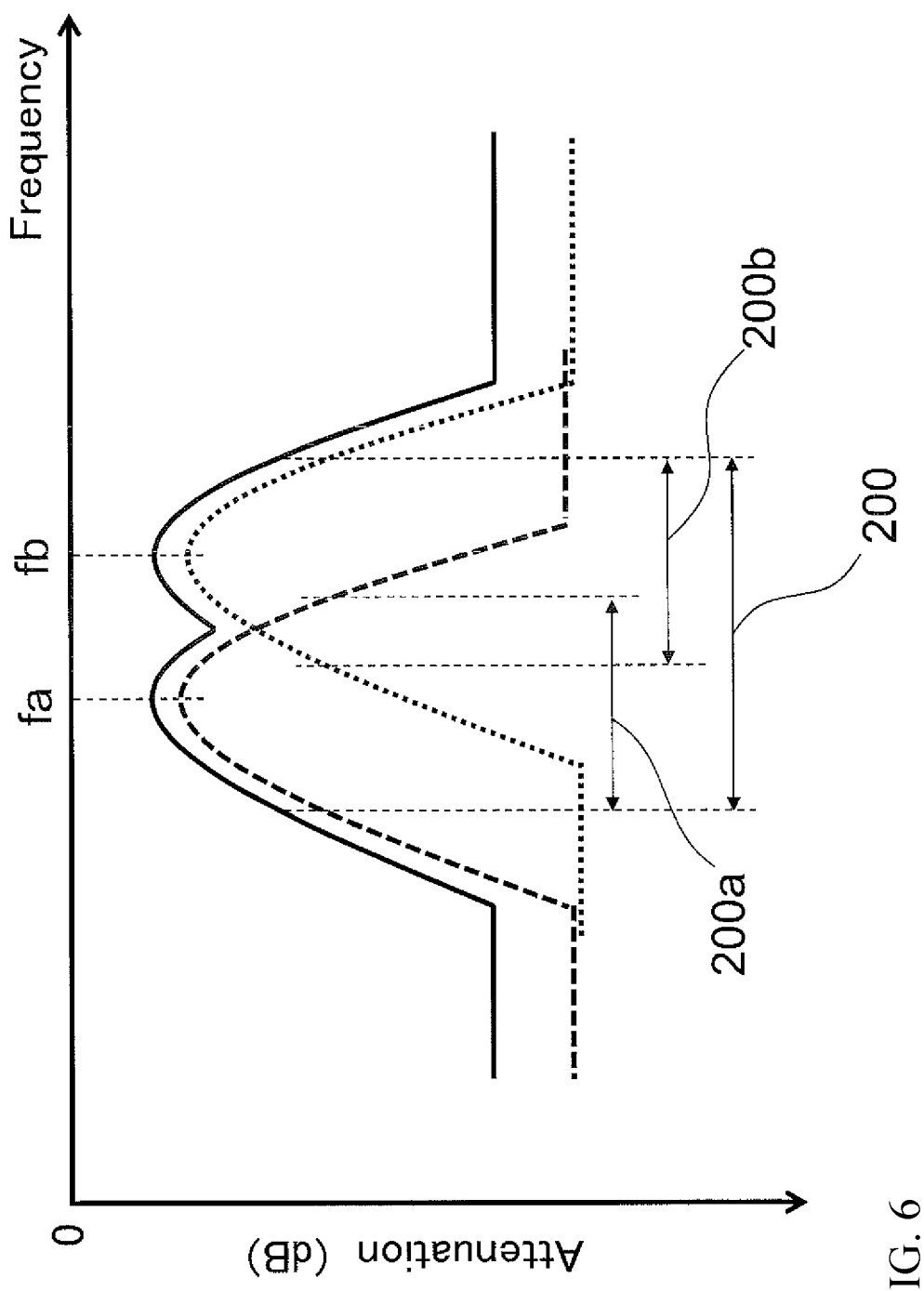
FIG. 6 is a graph illustrating the relationship between the frequency and the attenuation in the magnetoresistive effect device according to the second embodiment.

FIG. 6 is a graph illustrating the relationship between the frequency of the high-frequency signal input into the magnetoresistive effect device 101 and the attenuation. Referring to FIG. 6, the vertical axis represents attenuation and the horizontal axis represents frequency. As illustrated in FIG. 6, differentiating the aspect ratios of the plan view shapes of the magnetoresistive effect elements 1a and 1b from each other so that part of the frequencies near the spin torque resonance frequency fa of the magnetoresistive effect element 1a (a passband 200a illustrated in FIG. 6) is overlapped with part of the frequencies near the spin torque resonance frequency fb of the magnetoresistive effect element 1b (a passband 200b illustrated in FIG. 6) allows the magnetoresistive effect device 101 to have a passband (a passband 200 illustrated in FIG. 6) wider than that of the magnetoresistive effect device 100 of the first embodiment, as illustrated in FIG. 6.

In addition, varying the direct current to be applied to the magnetoresistive effect elements 1a and 1b or the strength of the magnetic field to be applied from the magnetic-field applying mechanism 12 to the magnetoresistive effect elements 1a and 1b enables the bandwidth of the magnetoresistive effect device 101 to be arbitrarily varied. Accordingly, the magnetoresistive effect device 101 functions as a variable frequency filter capable of arbitrarily varying the passband.

As described above, since the magnetoresistive effect elements 1a and 1b having different spin torque resonance frequencies from each other are connected in parallel to each other in the magnetoresistive effect device 101, the impedance of the multiple magnetoresistive effect elements near the multiple frequencies equal to the spin torque resonance frequencies of the respective magnetoresistive effect elements is reduced and the passband 200 having a certain width is provided. In addition, varying the direct current or the magnetic field to be applied to the magnetoresistive effect elements enables the positions of the passbands to be varied. In other words, the magnetoresistive effect device 101 functions as a variable frequency filter capable of varying the position of the passband.

Furthermore, since the plan view shapes of the multiple magnetoresistive effect elements 1a and 1b have different aspect ratios from each other in the magnetoresistive effect device 101, it is possible to manufacture the multiple magnetoresistive effect elements 1a and 1b having different spin torque resonance frequencies from each other through the same process. Specifically, since the multiple magnetoresistive effect elements 1a and 1b have the same film structure in the magnetoresistive effect device 101, it is possible to collectively form the films of the layers composing the multiple magnetoresistive effect elements 1a and 1b, thereby reducing the manufacturing cost.

Although the two magnetoresistive effect elements 1a and 1b having different spin torque resonance frequencies from each other are connected in parallel in the magnetoresistive effect device 101 of the second embodiment, three or more magnetoresistive effect elements having different spin torque resonance frequencies from each other may be connected in parallel. In this case, the width of the passband is further increased.

Although the two magnetoresistive effect elements 1a and 1b have the same film structure in the magnetoresistive effect device 101 of the second embodiment, the multiple magnetoresistive effect elements may have different film structures. In this case, the different film structures may be used while the aspect ratios of the plane view shapes of the multiple magnetoresistive effect elements are made equal to each other to differentiate the spin torque resonance frequencies of the multiple magnetoresistive effect elements from each other.

Although the same magnetic field is simultaneously applied to the two magnetoresistive effect elements 1a and 1b by the magnetic-field applying mechanism 12 in the magnetoresistive effect device 101 of the second embodiment, magnetic-field applying mechanisms for individually applying the magnetic fields to the respective magnetoresistive effect elements may be provided.

Third Embodiment

Figure 7:
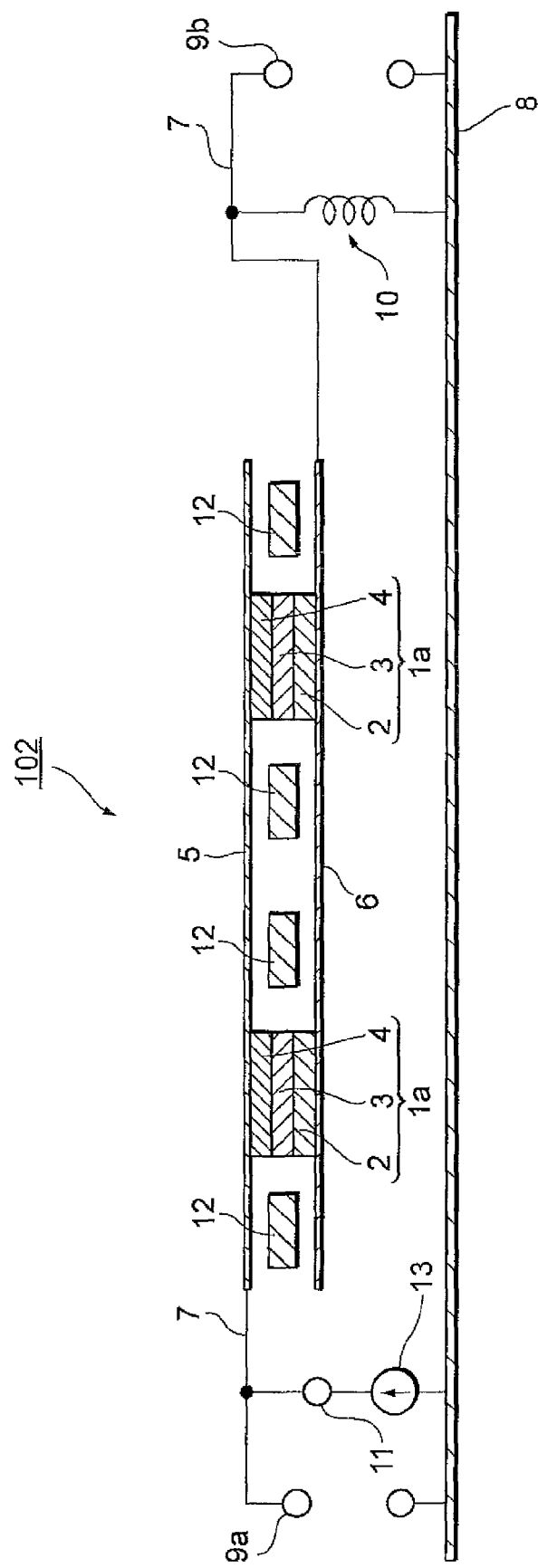
FIG. 7 is a schematic cross-sectional view of a magnetoresistive effect device according to a third embodiment.

FIG. 7 is a schematic cross-sectional view of a magnetoresistive effect device 102 according to a third embodiment of the present invention. Points different from the magnetoresistive effect device 100 of the first embodiment in the magnetoresistive effect device 102 will be mainly described and a description of common points will be appropriately omitted herein. The same reference numerals are used in the third embodiment to identify the same components in the magnetoresistive effect device 100 of the first embodiment and a description of the common components will be omitted herein. The magnetoresistive effect device 102 includes two magnetoresistive effect elements 1a each including the magnetization fixed layer 2, the spacer layer 3, and the magnetization free layer 4, the upper electrode 5, the lower electrode 6, the first port 9a, the second port 9b, the signal line 7, the choke coil 10 as an impedance element, the direct-current input terminal 11, and two magnetic-field applying mechanisms 12. The two magnetoresistive effect elements 1a have the same configuration and are connected in parallel to each other between the upper electrode 5 and the lower electrode 6. The first port 9a, the two magnetoresistive effect elements 1a connected in parallel to each other, and the second port 9b are connected in series in this order via the signal line 7. Each of the magnetic-field applying mechanisms 12 applies an individual magnetic field to the corresponding magnetoresistive effect element 1a. As described above, the magnetoresistive effect device 102 includes the two magnetic-field applying mechanisms 12 capable of applying an individual magnetic field to each of the two magnetoresistive effect elements 1a. The choke coil 10 is connected to the ground 8 and to the signal line 7 between the two magnetoresistive effect elements 1a connected in parallel to each other and the second port 9b. The direct-current input terminal 11 is connected to the signal line 7 at the opposite side to the choke coil 10 with the two magnetoresistive effect elements 1a, which are connected in parallel to each other, in between the direct-current input terminal 11 and the choke coil 10. The connection of the direct-current source 13 connected to the ground 8 to the direct-current input terminal 11 forms a closed circuit including the magnetoresistive effect elements 1a, the signal line 7, the choke coil 10, the ground 8, and the direct-current input terminal 11. The direct current supplied from the direct-current input terminal 11 flows through the closed circuit and is applied to the two magnetoresistive effect elements 1a.

The magnetization free layers 4 of the two magnetoresistive effect elements 1a are connected to the same upper electrode 5. The magnetization fixed layers 2 of the two magnetoresistive effect elements 1a are connected to the same lower electrode 6.

In the magnetoresistive effect device 102, the high-frequency signal is supplied to the two magnetoresistive effect elements 1a via the signal line 7 in a state in which the magnetic fields are individually applied from the respective magnetic-field applying mechanisms 12 to the corresponding magnetoresistive effect elements 1a. For example, the strength of the magnetic field to be applied to one of the magnetoresistive effect elements 1a is made smaller than the strength of the magnetic field to be applied to the other of the magnetoresistive effect elements 1a. Since the spin torque resonance frequencies of the magnetoresistive effect elements 1a are increased with an increase in strengths of the applied magnetic fields, the spin torque resonance frequencies of the two magnetoresistive effect elements 1a are different from each other in this case.

Due to the spin torque resonance phenomenon, the frequency components that coincide with the spin torque resonance frequency of either of the two magnetoresistive effect elements 1a or that are near the spin torque resonance frequency of either of the two magnetoresistive effect elements 1a, among the high-frequency components of the high-frequency signal input through the first port 9a, pass through the magnetoresistive effect elements 1a in a low impedance state and are supplied to the second port 9b. In other words, the magnetoresistive effect device 102 functions as a high-frequency filter using the frequencies near the spin torque resonance frequency of either of the two magnetoresistive effect elements 1a as the passband.

Figure 8:
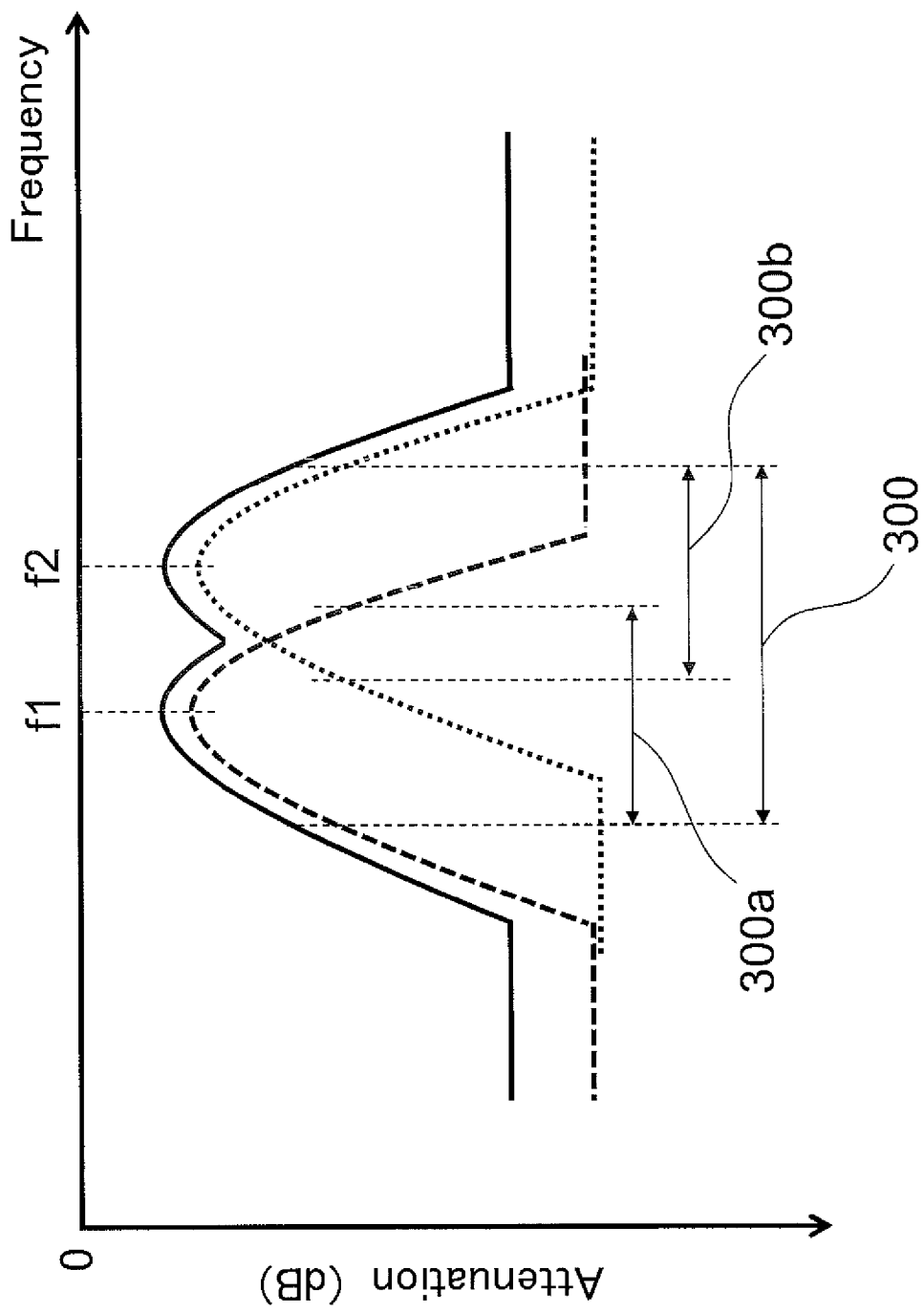
FIG. 8 is a graph illustrating the relationship between the frequency and the attenuation in the magnetoresistive effect device according to the third embodiment.

FIG. 8 is a graph illustrating the relationship between the frequency of the high-frequency signal input into the magnetoresistive effect device 102 and the attenuation. Referring to FIG. 8, the vertical axis represents attenuation and the horizontal axis represents frequency. For example, as illustrated in FIG. 8, when the magnetic field to be applied to one of the magnetoresistive effect elements 1a is made smaller than the magnetic field to be applied to the other of the magnetoresistive effect elements 1a, f1<f2 where f1 denotes the spin torque resonance frequency of the one of the magnetoresistive effect elements 1a and f2 denotes the spin torque resonance frequency of the other of the magnetoresistive effect elements 1a. Accordingly, as illustrated in FIG. 8, adjusting the strength of the magnetic field to be applied from each of the magnetic-field applying mechanisms 12 to the corresponding magnetoresistive effect element 1a so that part of the frequencies near the spin torque resonance frequency f1 of the one of the magnetoresistive effect elements 1a (a passband 300a illustrated in FIG. 8) is overlapped with part of the frequencies near the spin torque resonance frequency f2 of the other of the magnetoresistive effect elements 1a (a passband 300b illustrated in FIG. 8) allows the magnetoresistive effect device 102 to have a passband (a passband 300 illustrated in FIG. 8) wider than that of the magnetoresistive effect device 100 of the first embodiment, as illustrated in FIG. 8.

In addition, varying the direct current to be applied to each of the magnetoresistive effect elements 1a or the strength of the magnetic field to be applied from each of the magnetic-field applying mechanisms 12 to the corresponding magnetoresistive effect element 1a enables the bandwidth of the magnetoresistive effect device 102 to be arbitrarily varied. Accordingly, the magnetoresistive effect device 102 functions as a variable frequency filter capable of arbitrarily varying the passband.

As described above, since the magnetoresistive effect device 102 has the multiple magnetic-field applying mechanisms 12 so as to apply an individual magnetic field to each of the multiple magnetoresistive effect elements 1a, the magnetoresistive effect device 102 is capable of individually controlling the spin torque resonance frequencies of the respective magnetoresistive effect elements 1a. In addition, since the multiple magnetoresistive effect elements 1a are connected in parallel to each other, the impedance of the multiple magnetoresistive effect elements near the multiple frequencies equal to the spin torque resonance frequencies of the respective magnetoresistive effect elements 1a is reduced and the passband 300 having a certain width is provided. Furthermore, varying the direct current or the magnetic field to be applied to each of the magnetoresistive effect elements 1a enables the bandwidth of the magnetoresistive effect device 102 to be arbitrarily varied. Accordingly, the magnetoresistive effect device 102 functions as the variable frequency filter capable of arbitrarily varying the passband.

In addition, although the two magnetoresistive effect elements 1a are connected in parallel to each other and the two magnetic-field applying mechanisms 12 for individually applying the magnetic fields to the respective magnetoresistive effect elements 1a are provided in the magnetoresistive effect device 102 of the third embodiment, three or more magnetoresistive effect elements 1a may be connected in parallel to each other and three of more magnetic-field applying mechanisms 12 for individually applying the magnetic fields to the respective magnetoresistive effect elements 1a may be provided. In this case, it is possible to further increase the width of the passband.

Furthermore, although the two magnetoresistive effect elements 1a have the same configuration in the magnetoresistive effect device 102 of the third embodiment, the multiple magnetoresistive effect elements may have different configurations.

Fourth Embodiment

Figure 9:
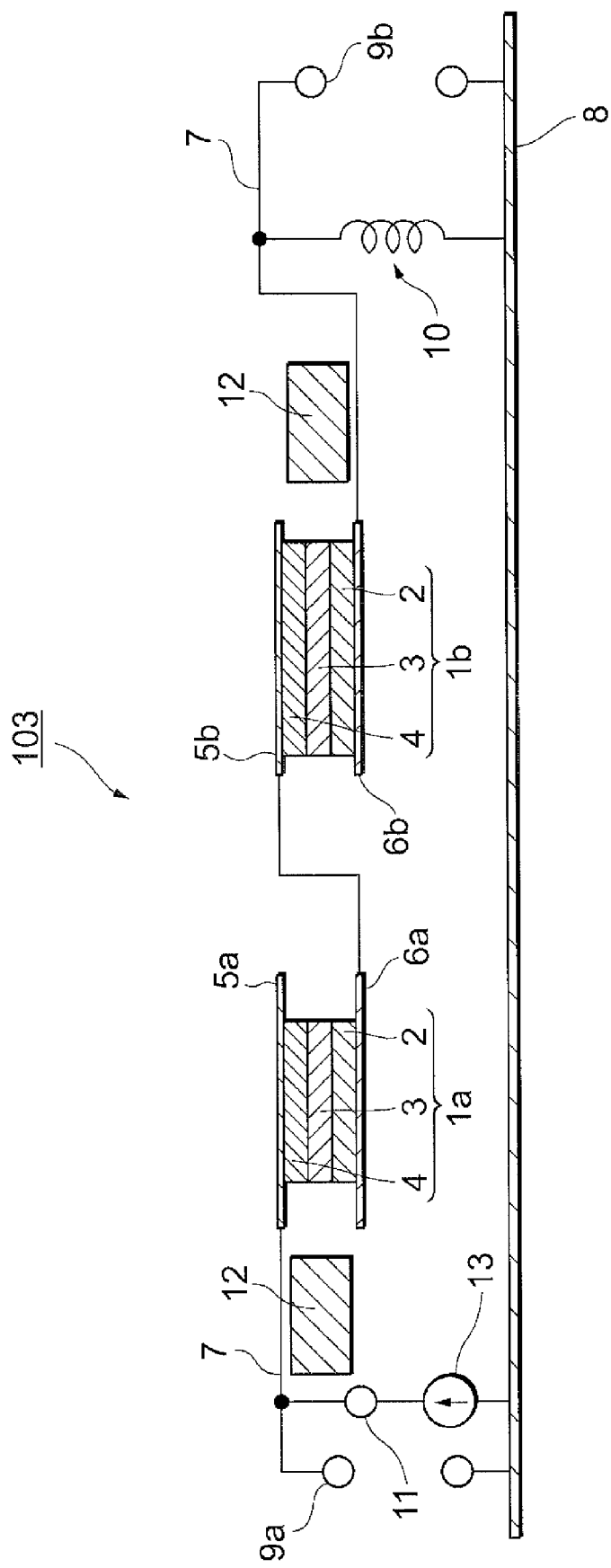
FIG. 9 is a schematic cross-sectional view of a magnetoresistive effect device according to a fourth embodiment.

FIG. 9 is a schematic cross-sectional view of a magnetoresistive effect device 103 according to a fourth embodiment of the present invention. Points different from the magnetoresistive effect device 100 of the first embodiment in the magnetoresistive effect device 103 will be mainly described and a description of common points will be appropriately omitted herein. The same reference numerals are used in the fourth embodiment to identify the same components in the magnetoresistive effect device 100 of the first embodiment and a description of the common components will be omitted herein. The magnetoresistive effect device 103 includes the two magnetoresistive effect elements 1a and 1b each including the magnetization fixed layer 2, the spacer layer 3, and the magnetization free layer 4, upper electrodes 5a and 5b, lower electrodes 6a and 6b, the first port 9a, the second port 9b, the signal line 7, the choke coil 10 as an impedance element, the direct-current input terminal 11, and the magnetic-field applying mechanism 12. The upper electrode 5a and the lower electrode 6a are disposed so as to sandwich the magnetoresistive effect element 1a therebetween and the upper electrode 5b and the lower electrode 6b are disposed so as to sandwich the magnetoresistive effect element 1b therebetween. The magnetoresistive effect element 1a is connected in series to the magnetoresistive effect element 1b. The first port 9a, the magnetoresistive effect element 1a, the magnetoresistive effect element 1b, and the second port 9b are connected in series in this order via the signal line 7. The magnetoresistive effect elements 1a and 1b have different spin torque resonance frequencies from each other in a state in which the same magnetic field and the direct current having the same current density are applied. More specifically, although the magnetoresistive effect elements 1a and 1b have the same film structure and have rectangular shapes in plan view, the plan view shape of the magnetoresistive effect element 1a is different from the plan view shape of the magnetoresistive effect element 1a in the aspect ratio. "The same film structure" means that the magnetoresistive effect elements 1a and 1b have the same material and the same film thickness of each layer composing the magnetoresistive effect elements and have the same lamination order of the layers. "The plan view shape" means the shape of each of the magnetoresistive effect elements when the magnetoresistive effect element is viewed from above a plane perpendicular to the stacking direction of the respective layers composing the magnetoresistive effect element. "The aspect ratio" means the ratio of the length of long sides to the length of short sides of a rectangle circumscribed around the plan view shape of the magnetoresistive effect element with a minimum area.

The choke coil 10 is connected to the ground 8 and to the signal line 7 between the magnetoresistive effect element 1b and the second port 9b. The direct-current input terminal 11 is connected to the signal line 7 at the opposite side to the choke coil 10 with the magnetoresistive effect element 1a and the magnetoresistive effect element 1b in between the direct-current input terminal 11 and the choke coil 10. The connection of the direct-current source 13 connected to the ground 8 to the direct-current input terminal 11 forms a closed circuit including the magnetoresistive effect element 1a, the magnetoresistive effect element 1b, the signal line 7, the choke coil 10, the ground 8, and the direct-current input terminal 11. The direct current supplied from the direct-current input terminal 11 flows through the closed circuit and is applied to the magnetoresistive effect element 1a and the magnetoresistive effect element 1b.

The lower electrode 6a to which the magnetization fixed layer 2 of the magnetoresistive effect element 1a is connected is electrically connected to the upper electrode 5b to which the magnetization free layer 4 of the magnetoresistive effect element 1b is connected. The magnetoresistive effect elements 1a and 1b are connected in series to each other.

The magnetic-field applying mechanism 12 is disposed near the magnetoresistive effect elements 1a and 1b and simultaneously applies the same magnetic field to the magnetoresistive effect elements 1a and 1b. The magnetic-field applying mechanism 12 varies the magnetic fields to be applied to the magnetoresistive effect elements 1a and 1b to vary the spin torque resonance frequencies of the magnetoresistive effect elements 1a and 1b.

Figure 10:
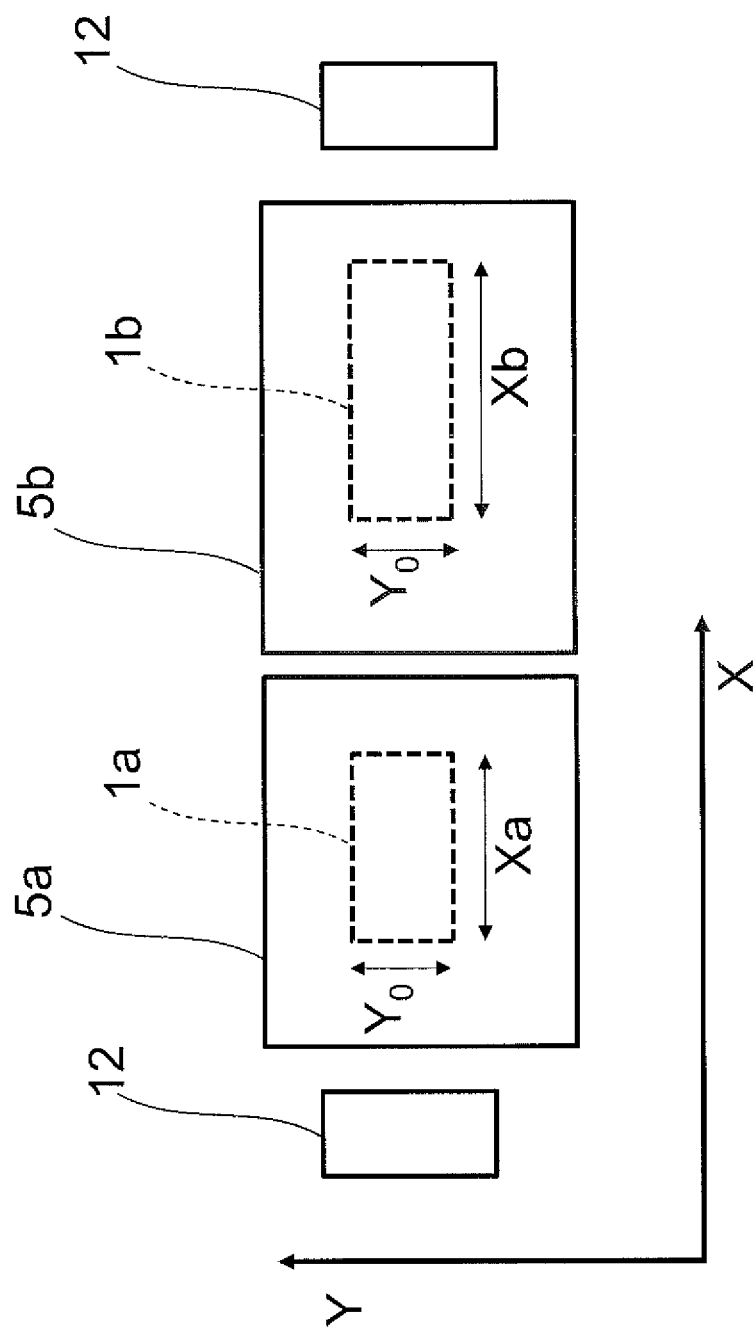
FIG. 10 is a top view of the magnetoresistive effect device according to the fourth embodiment.

The film structures of the magnetoresistive effect elements 1a and 1b are the same as the film structure of the magnetoresistive effect element 1a of the first embodiment. FIG. 10 is a top view of the magnetoresistive effect device 103. As illustrated in FIG. 10, the magnetoresistive effect elements 1a and 1b have the same dimension $Y_0$ in the Y direction, which is the direction of the short sides of the plan view shapes of the magnetoresistive effect elements 1a and 1b. However, the dimension Xa in the X direction, which is the direction of the long sides of the plane view shape of the magnetoresistive effect element 1a, is different from the dimension Xb in the X direction, which is the direction of the long sides of the plane view shape of the magnetoresistive effect element 1b, and Xa<Xb. Accordingly, the aspect ratio ($Xb/Y_0$) of the plan view shape of the magnetoresistive effect element 1b is higher than the aspect ratio ($Xa/Y_0$) of the plan view shape of the magnetoresistive effect element 1a. In consideration of the state in which the same magnetic field and the direct current of the same current density are applied to each magnetoresistive effect element, the spin torque resonance frequency of the magnetoresistive effect element is increased with an increase in aspect ratio of the plan view shape of the magnetoresistive effect element. As a result, the spin torque resonance frequency fb of the magnetoresistive effect element 1b is higher than the spin torque resonance frequency fa of the magnetoresistive effect element 1a. Since differentiating the aspect ratios of the plan view shapes of the multiple magnetoresistive effect elements in the above manner enables the spin torque resonance frequencies to be differentiated from each other even when the magnetoresistive effect elements have the same film structure, it is possible to manufacture the multiple magnetoresistive effect elements having different spin torque resonance frequencies from each other through the same film formation process. In other words, since the multiple magnetoresistive effect elements have the same film structure, it is possible to collectively form the films of the layers composing the multiple magnetoresistive effect elements. In addition, in the magnetoresistive effect device 103, since the magnetoresistive effect elements 1a and 1b are connected in series to each other and the area of the cross section of the magnetoresistive effect element 1a in a direction perpendicular to the direction in which the direct current flows is smaller than the area of the cross section of the magnetoresistive effect element 1b in the direction, the current density of the direct current applied to the magnetoresistive effect element 1a is higher than that of the direct current applied to the magnetoresistive effect element 1b. As described above, the spin torque resonance frequency of the magnetoresistive effect element is reduced with an increase in current density of the applied direct current. Accordingly, the plan view shape of the magnetoresistive effect element 1a is different from the plan view shape of the magnetoresistive effect element 1b in the aspect ratio and the current density of the applied direct current and fa<fb.

Due to the spin torque resonance phenomenon, the frequency components that coincide with the spin torque resonance frequency of the magnetoresistive effect element 1a or the magnetoresistive effect element 1b or that are near the spin torque resonance frequency of the magnetoresistive effect element 1a or the magnetoresistive effect element 1b, among the high-frequency components of the high-frequency signal input through the first port 9a, pass through the magnetoresistive effect element 1a and the magnetoresistive effect element 1b in a low impedance state, which are connected in series to each other, and are supplied to the second port 9b. In other words, the magnetoresistive effect device 103 functions as a high-frequency filter using the frequencies near the spin torque resonance frequency of the magnetoresistive effect element 1a or the magnetoresistive effect element 1b as the passband.

Figure 11:
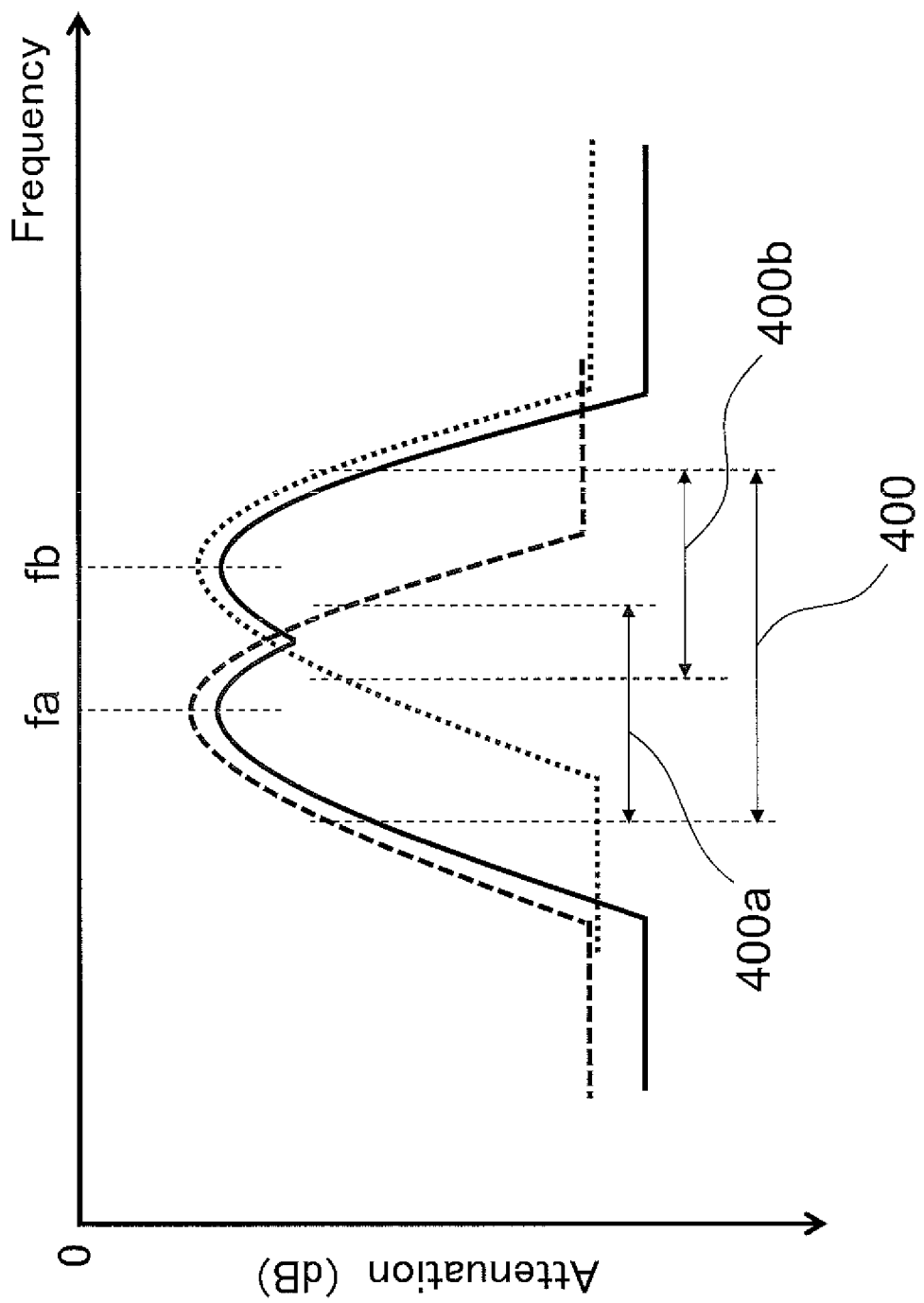
FIG. 11 is a graph illustrating the relationship between the frequency and the attenuation in the magnetoresistive effect device according to the fourth embodiment.

FIG. 11 is a graph illustrating the relationship between the frequency of the high-frequency signal input into the magnetoresistive effect device 103 and the attenuation. Referring to FIG. 11, the vertical axis represents attenuation and the horizontal axis represents frequency. As illustrated in FIG. 11, differentiating the aspect ratios of the plan view shapes of the magnetoresistive effect elements 1a and 1b from each other so that part of the frequencies near the spin torque resonance frequency fa of the magnetoresistive effect element 1a (a passband 400a illustrated in FIG. 11) is overlapped with part of the frequencies near the spin torque resonance frequency fb of the magnetoresistive effect element 1b (a passband 400b illustrated in FIG. 11) allows the magnetoresistive effect device 103 to have a passband (a passband 400 illustrated in FIG. 11) wider than that of the magnetoresistive effect device 100 of the first embodiment, as illustrated in FIG. 11.

In addition, varying the direct current to be applied to the magnetoresistive effect elements 1a and 1b or the strength of the magnetic field to be applied from the magnetic-field applying mechanism 12 to the magnetoresistive effect elements 1a and 1b enables the bandwidth of the magnetoresistive effect device 103 to be arbitrarily varied. Accordingly, the magnetoresistive effect device 103 functions as a variable frequency filter capable of arbitrarily varying the passband.

As described above, since the multiple magnetoresistive effect elements 1a and 1b having different spin torque resonance frequencies from each other are connected in series to each other in the magnetoresistive effect device 103, the impedance of the multiple magnetoresistive effect elements near the multiple frequencies equal to the spin torque resonance frequencies of the respective magnetoresistive effect elements is reduced and the passband 400 having a certain width is provided. In addition, varying the direct current or the magnetic field to be applied to the magnetoresistive effect elements enables the positions of the passbands to be varied. In other words, the magnetoresistive effect device 103 functions as a variable frequency filter capable of varying the position of the passband.

Furthermore, since the plan view shapes of the multiple magnetoresistive effect elements 1a and 1b have different aspect ratios from each other in the magnetoresistive effect device 103, it is possible to manufacture the multiple magnetoresistive effect elements 1a and 1b having different spin torque resonance frequencies from each other through the same process. Specifically, since the multiple magnetoresistive effect elements 1a and 1b have the same film structure in the magnetoresistive effect device 103, it is possible to collectively form the films of the layers composing the multiple magnetoresistive effect elements 1a and 1b, thereby reducing the manufacturing cost.

Although the two magnetoresistive effect elements 1a and 1b having different spin torque resonance frequencies from each other are connected in series to each other in the magnetoresistive effect device 103 of the fourth embodiment, three or more magnetoresistive effect elements having different spin torque resonance frequencies from each other may be connected in series to each other. In this case, the width of the passband is further increased.

Although the two magnetoresistive effect elements 1a and 1b have the same film structure in the magnetoresistive effect device 103 of the fourth embodiment, the multiple magnetoresistive effect elements may have different film structures. In this case, the different film structures may be used while the aspect ratios of the plane view shapes of the multiple magnetoresistive effect elements are made equal to each other to differentiate the spin torque resonance frequencies of the multiple magnetoresistive effect elements from each other.

Although the same magnetic field is simultaneously applied to the magnetoresistive effect elements 1a and 1b by the magnetic-field applying mechanism 12 in the magnetoresistive effect device 103 of the fourth embodiment, magnetic-field applying mechanisms for individually applying the magnetic fields to the respective magnetoresistive effect elements may be provided, as in the third embodiment.

Fifth Embodiment

Figure 12:
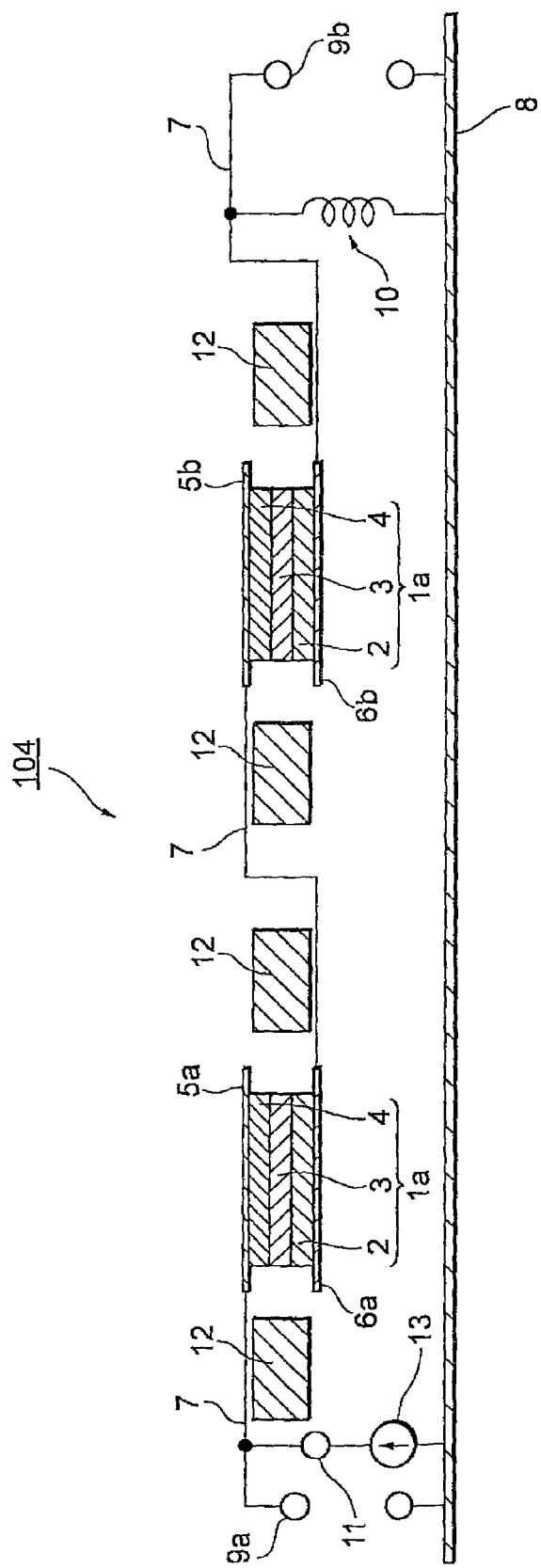
FIG. 12 is a schematic cross-sectional view of a magnetoresistive effect device according to a fifth embodiment.

FIG. 12 is a schematic cross-sectional view of a magnetoresistive effect device 104 according to a fifth embodiment of the present invention. Points different from the magnetoresistive effect device 100 of the first embodiment in the magnetoresistive effect device 104 will be mainly described and a description of common points will be appropriately omitted herein. The same reference numerals are used in the fifth embodiment to identify the same components in the magnetoresistive effect device 100 of the first embodiment and a description of the common components will be omitted herein. The magnetoresistive effect device 104 includes the two magnetoresistive effect elements 1a each including the magnetization fixed layer 2, the spacer layer 3, and the magnetization free layer 4, the upper electrodes 5a and 5b, the lower electrodes 6a and 6b, the first port 9a, the second port 9b, the signal line 7, the choke coil 10 as an impedance element, the direct-current input terminal 11, and the two magnetic-field applying mechanisms 12. The two magnetoresistive effect elements 1a have the same configuration. The upper electrode 5a and the lower electrode 6a are disposed so as to sandwich the magnetoresistive effect element 1a therebetween and the upper electrode 5b and the lower electrode 6b are disposed so as to sandwich the magnetoresistive effect element 1b therebetween. The two magnetoresistive effect elements 1a are connected in series to each other. The first port 9a, the magnetoresistive effect elements 1a, and the second port 9b are connected in series in this order via the signal line 7. Each of the magnetic-field applying mechanisms 12 applies an individual magnetic field to the corresponding magnetoresistive effect element 1a. As described above, the magnetoresistive effect device 104 includes the two magnetic-field applying mechanisms 12 capable of applying an individual magnetic field to each of the two magnetoresistive effect elements 1a. The choke coil 10 is connected to the ground 8 and to the signal line 7 between the two magnetoresistive effect elements 1a connected in series to each other and the second port 9b. The direct-current input terminal 11 is connected to the signal line 7 at the opposite side to the choke coil 10 with the two magnetoresistive effect elements 1a, which are connected in series to each other, between the direct-current input terminal 11 and the choke coil 10. The connection of the direct-current source 13 connected to the ground 8 to the direct-current input terminal 11 forms a closed circuit including the two magnetoresistive effect elements 1a connected in series to each other, the signal line 7, the choke coil 10, the ground 8, and the direct-current input terminal 11. The direct current supplied from the direct-current input terminal 11 flows through the closed circuit and is applied to the two magnetoresistive effect elements 1a.

The lower electrode 6a to which the magnetization fixed layer 2 of one of the magnetoresistive effect elements 1a is connected is electrically connected to the upper electrode 5b to which the magnetization free layer 4 of the other of the magnetoresistive effect elements 1a is connected. The two magnetoresistive effect elements 1a are connected in series to each other.

In the magnetoresistive effect device 104, the high-frequency signal is supplied to the two magnetoresistive effect elements 1a via the signal line 7 in a state in which the magnetic fields are individually applied from the respective magnetic-field applying mechanisms 12 to the corresponding magnetoresistive effect elements 1a. For example, the strength of the magnetic field to be applied to one of the magnetoresistive effect elements 1a is made smaller than the strength of the magnetic field to be applied to the other of the magnetoresistive effect elements 1a. Since the spin torque resonance frequencies of the magnetoresistive effect elements 1a are increased with an increase in strengths of the applied magnetic fields, the spin torque resonance frequencies of the two magnetoresistive effect elements 1a are different from each other in this case.

Due to the spin torque resonance phenomenon, the frequency components that coincide with the spin torque resonance frequency of either of the two magnetoresistive effect elements 1a or that are near the spin torque resonance frequency of either of the two magnetoresistive effect elements 1a, among the high-frequency components of the high-frequency signal input through the first port 9a, pass through the two magnetoresistive effect elements 1a in a low impedance state, which are connected in series to each other, and are supplied to the second port 9b. In other words, the magnetoresistive effect device 104 functions as a high-frequency filter using the frequencies near the spin torque resonance frequency of either of the two magnetoresistive effect elements 1a as the passband.

Figure 13:
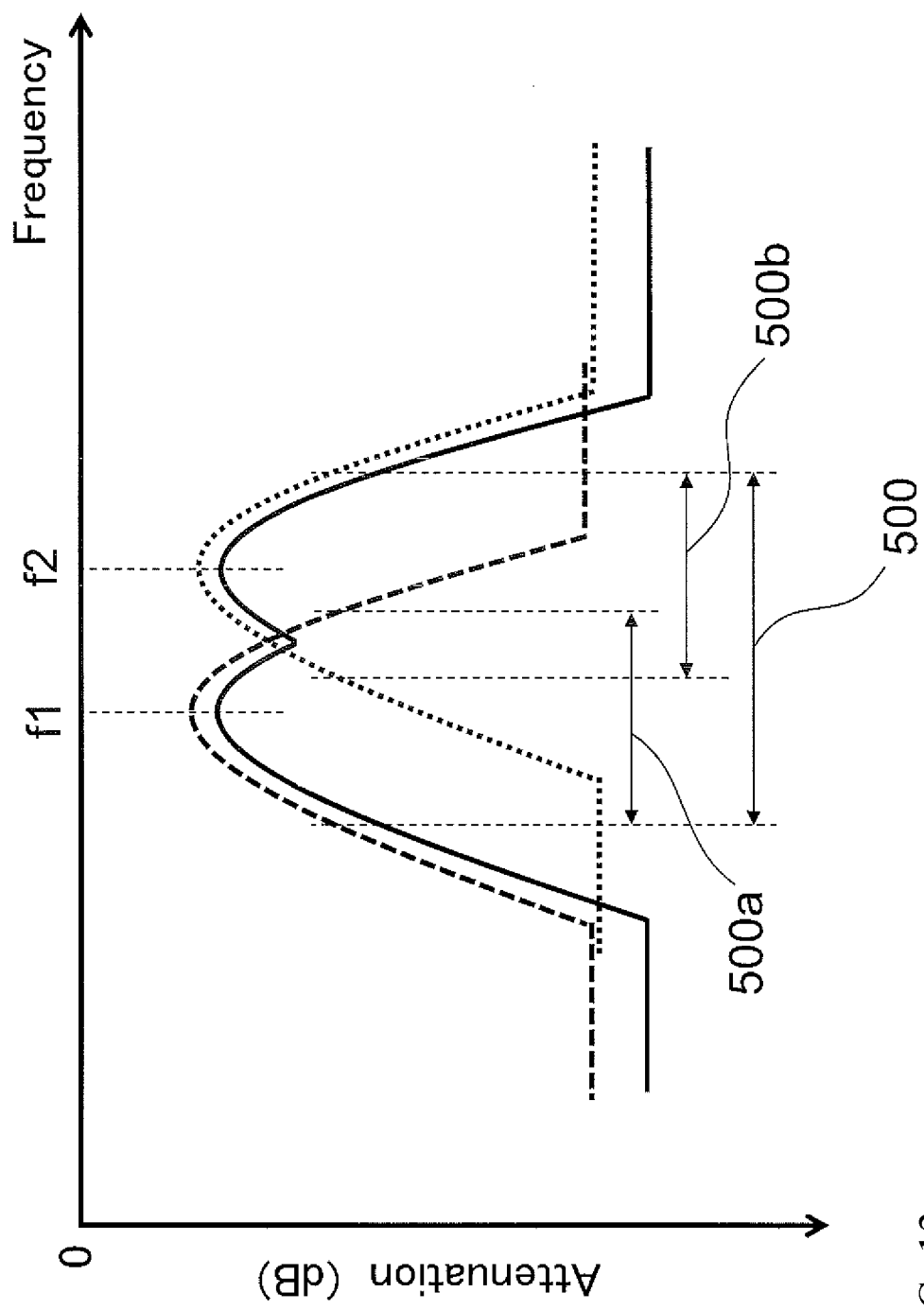
FIG. 13 is a graph illustrating the relationship between the frequency and the attenuation in the magnetoresistive effect device according to the fifth embodiment.

FIG. 13 is a graph illustrating the relationship between the frequency of the high-frequency signal input into the magnetoresistive effect device 104 and the attenuation. Referring to FIG. 13, the vertical axis represents attenuation and the horizontal axis represents frequency. For example, as illustrated in FIG. 13, when the magnetic field to be applied to one of the magnetoresistive effect elements 1a is made smaller than the magnetic field to be applied to the other of the magnetoresistive effect elements 1a, $f1 < f2$ where $f1$ denotes the spin torque resonance frequency of the one of the magnetoresistive effect elements 1a and f2 denotes the spin torque resonance frequency of the other of the magnetoresistive effect elements 1a. Accordingly, as illustrated in FIG. 13, adjusting the strength of the magnetic field to be applied from each of the magnetic-field applying mechanisms 12 to the corresponding magnetoresistive effect element 1a so that part of the frequencies near the spin torque resonance frequency f1 of the one of the magnetoresistive effect elements 1a (a passband 500a illustrated in FIG. 13) is overlapped with part of the frequencies near the spin torque resonance frequency f2 of the other of the magnetoresistive effect elements 1a (a passband 500b illustrated in FIG. 13) allows the magnetoresistive effect device 104 to have a passband (a passband 500 illustrated in FIG. 13) wider than that of the magnetoresistive effect device 100 of the first embodiment, as illustrated in FIG. 13.

In addition, varying the direct current to be applied to each of the magnetoresistive effect elements 1a or the strength of the magnetic field to be applied from each of the magnetic-field applying mechanisms 12 to the corresponding magnetoresistive effect element 1a enables the bandwidth of the magnetoresistive effect device 104 to be arbitrarily varied. Accordingly, the magnetoresistive effect device 104 functions as a variable frequency filter capable of arbitrarily varying the passband.

As described above, since the magnetoresistive effect device 104 has the multiple magnetic-field applying mechanisms 12 so as to apply an individual magnetic field to each of the multiple magnetoresistive effect elements 1a, the magnetoresistive effect device 104 is capable of individually controlling the spin torque resonance frequencies of the respective magnetoresistive effect elements 1a. In addition, since the multiple magnetoresistive effect elements 1a are connected in series to each other, the impedance of the multiple magnetoresistive effect elements near the multiple frequencies equal to the spin torque resonance frequencies of the respective magnetoresistive effect elements 1a is reduced and the passband 500 having a certain width is provided. Furthermore, varying the direct current or the magnetic field to be applied to each of the magnetoresistive effect elements 1a enables the bandwidth of the magnetoresistive effect device 104 to be arbitrarily varied. Accordingly, the magnetoresistive effect device 104 functions as the variable frequency filter capable of arbitrarily varying the passband.

In addition, although the two magnetoresistive effect elements 1a are connected in series to each other and the two magnetic-field applying mechanisms 12 for individually applying the magnetic fields to the respective magnetoresistive effect elements 1a are provided in the magnetoresistive effect device 104 of the fifth embodiment, three or more magnetoresistive effect elements 1a may be connected in series to each other and three of more magnetic-field applying mechanisms 12 for individually applying the magnetic fields to the respective magnetoresistive effect elements 1a may be provided. In this case, it is possible to further increase the width of the passband.

Furthermore, although the two magnetoresistive effect elements 1a have the same configuration in the magnetoresistive effect device 104 of the fifth embodiment, the multiple magnetoresistive effect elements may have different configurations.

Although the embodiments of the present invention have been described above, it will be clear that the present invention is not limited to these specific examples and embodiments and that many changes and modified embodiments will be obvious to those skilled in the art. For example, although the examples are described in the first to fifth embodiment in which the choke coil 10 is connected to the ground 8 and to the signal line 7 between the magnetoresistive effect element 1a (1b) and the second port 9b and the direct-current input terminal 11 is connected to the signal line 7 between the magnetoresistive effect element 1a (1b) and the first port 9a, the choke coil 10 may be connected to the ground 8 and to the signal line 7 between the magnetoresistive effect element 1a (1b) and the first port 9a and the direct-current input terminal 11 may be connected to the signal line 7 between the magnetoresistive effect element 1a (1b) and the second port 9b.

Although the example in which the choke coil 10 is used as the impedance element is described above in the first to fifth embodiments, a resistance element may be used as the impedance element, instead of the choke coil 10. In this case, the resistance element is connected between the signal line 7 and the ground 8 and has a function to cut off the high-frequency components of the current with its resistance component. The resistance element may be a chip resistor or a resistor composed of a pattern line. The resistance element preferably has a resistance value of the characteristic impedance of the signal line 7 or more. For example, when the signal line 7 has a characteristic impedance of 50 Ω, 45% of the high-frequency power is capable of being cut off with the resistance element when the resistance element has a resistance value of 50Ω and 90% of the high-frequency power is capable of being cut off with the resistance element when the resistance element has a resistance value of 500Ω. The use of the resistance element enables direct current applied from the direct-current input terminal 11 to flow through the closed circuit including the magnetoresistive effect element 1a (1b), the signal line 7, the resistance element, the ground 8, and the direct-current input terminal 11 without degrading the characteristics of the high-frequency signal passing through the magnetoresistive effect element 1a (1b).

When the resistance element is used as the impedance element, it is preferred that a capacitor for cutting off the direct current signal is connected in series to the signal line 7 between the first port 9a and the direct-current input terminal 11 (or the resistance element) and a capacitor for cutting off the direct current signal is connected in series to the signal line 7 between the second port 9b and the resistance element (or the direct-current input terminal 11). This because it is possible to cause the direct current applied from the direct-current input terminal 11 to efficiently flow through the closed circuit including the magnetoresistive effect element 1a (1b), the signal line 7, the resistance element, the ground 8, and the direct-current input terminal 11.

What is claimed is:
1. A magnetoresistive effect device comprising:
at least one magnetoresistive effect element;
a first port through which a high-frequency signal is input;
a second port through which a high-frequency signal is output;
a signal line;
an impedance element; and
a direct-current input terminal,
wherein the first port, the magnetoresistive effect element, and the second port are connected in series in this order via the signal line,
wherein the impedance element (i) is connected to the signal line between the magnetoresistive effect element and the first port or the second port, and (ii) is further able to be connected to a ground;

wherein the direct-current input terminal is connected to the signal line, and the magnetoresistive effect element is between (i) a location at which the impedance element is connected to the signal line, and (ii) a location at which the direct-current input terminal is connected to the signal line, and wherein the magnetoresistive effect device is able to form a closed circuit when it is connected to the ground, where the closed circuit includes the magnetoresistive effect element, the signal line, the impedance element, the ground, and the direct-current input terminal.

2. The magnetoresistive effect device according to claim 1, further comprising at least one magnetic-field applying mechanism that is configured to apply a magnetic field to the magnetoresistive effect element.

3. The magnetoresistive effect device according to claim 2, wherein the magnetic-field applying mechanism is configured to vary the magnetic field to vary a spin torque resonance frequency of the magnetoresistive effect element.

4. The magnetoresistive effect device according to claim 1, wherein the at least one magnetoresistive effect element includes a plurality of magnetoresistive effect elements having different spin torque resonance frequencies from each other, and wherein the magnetoresistive effect elements are connected in parallel to each other.

5. The magnetoresistive effect device according to claim 2, wherein the at least one magnetoresistive effect element includes a plurality of magnetoresistive effect elements, wherein the at least one magnetic-field applying mechanism includes a plurality of magnetic-field applying mechanisms, and wherein the magnetoresistive effect elements are connected in parallel to each other and the magnetic-field applying mechanisms are provided so as to apply an individual magnetic field to each of the magnetoresistive effect elements.

6. The magnetoresistive effect device according to claim 1, wherein the at least one magnetoresistive effect element includes a plurality of magnetoresistive effect elements having different spin torque resonance frequencies from each other, and wherein the magnetoresistive effect elements are connected in series to each other.

7. The magnetoresistive effect device according to claim 2, wherein the at least one magnetoresistive effect element includes a plurality of magnetoresistive effect elements, wherein the at least one magnetic-field applying mechanism includes a plurality of magnetic-field applying mechanisms, and wherein the magnetoresistive effect elements are connected in series to each other and the magnetic-field applying mechanisms are provided so as to apply an individual magnetic field to each of the magnetoresistive effect elements.

8. The magnetoresistive effect device according to claim 4, wherein plan view shapes of the magnetoresistive effect elements having different spin torque resonance frequencies from each other have different aspect ratios from each other.

9. The magnetoresistive effect device according to claim 6, wherein plan view shapes of the magnetoresistive effect elements having different spin torque resonance frequencies from each other have different aspect ratios from each other.

10. The magnetoresistive effect device according to claim 1, wherein the magnetoresistive effect device does not include a magnetoresistive effect element connected to the signal line and the ground in parallel with the second port.

* * * * *